(12) United States Patent
Shallal et al.

(10) Patent No.: US 11,687,247 B2
(45) Date of Patent: *Jun. 27, 2023

(54) HIGH-THROUGHPUT LOW-LATENCY HYBRID MEMORY MODULE

(71) Applicant: Rambus Inc., San Jose, CA (US)

(72) Inventors: Aws Shallal, Cary, NC (US); Michael Miller, Raleigh, NC (US); Stephen Horn, Raleigh, NC (US)

(73) Assignee: Rambus Inc., San Jose, CA (US)

( * ) Notice: Subject to any disclaimer, the term of this patent is extended or adjusted under 35 U.S.C. 154(b) by 106 days.

This patent is subject to a terminal disclaimer.

(21) Appl. No.: 17/339,683

(22) Filed: Jun. 4, 2021

(65) Prior Publication Data

US 2021/0357131 A1 Nov. 18, 2021

Related U.S. Application Data

(63) Continuation of application No. 16/535,814, filed on Aug. 8, 2019, now Pat. No. 11,036,398, which is a
(Continued)

(51) Int. Cl.
*G06F 3/06* (2006.01)
*G06F 12/0802* (2016.01)
(Continued)

(52) U.S. Cl.
CPC ............ *G06F 3/0613* (2013.01); *G06F 3/065* (2013.01); *G06F 3/0611* (2013.01); *G06F 3/0656* (2013.01); *G06F 3/0659* (2013.01); *G06F 3/0679* (2013.01); *G06F 3/0685* (2013.01); *G06F 11/00* (2013.01); *G06F 12/0802* (2013.01); *G06F 12/1441* (2013.01); *G06F 13/1673* (2013.01); *G11C 5/04* (2013.01); *G11C 11/005* (2013.01); *G11C 14/0009* (2013.01);
(Continued)

(58) Field of Classification Search
None
See application file for complete search history.

(56) References Cited

U.S. PATENT DOCUMENTS 7,644,226 B1 1/2010 Isaac et al.
2007/0273386 A1 11/2007 Wang et al.
(Continued)

*Primary Examiner* — Kaushikkumar M Patel
(74) *Attorney, Agent, or Firm* — Lowenstein Sandler LLP

(57) ABSTRACT

Disclosed herein are techniques for implementing high-throughput low-latency hybrid memory modules with improved data backup and restore throughput, enhanced non-volatile memory controller (NVC) resource access, and enhanced mode register setting programmability. Embodiments comprise a command replicator to generate sequences of one or more DRAM read and/or write and/or other commands to be executed in response to certain local commands from a non-volatile memory controller (NVC) during data backup and data restore operations. Other embodiments comprise an access engine to enable an NVC in a host control mode to trigger entry into a special mode and issue commands to access a protected register space. Some embodiments comprise a mode register controller to capture and store the data comprising mode register setting commands issued during a host control mode, such that an NVC can program the DRAM mode registers in an NVC control mode.

20 Claims, 21 Drawing Sheets

Related U.S. Application Data continuation of application No. 16/042,374, filed on Jul. 23, 2018, now Pat. No. 10,379,752, which is a continuation of application No. 14/883,155, filed on Oct. 14, 2015, now Pat. No. 10,031,677.

(51) Int. Cl.

| | | |
|---|---|---|
| *G06F 12/14* | (2006.01) | |
| *G11C 14/00* | (2006.01) | |
| *G11C 5/04* | (2006.01) | |
| *G11C 11/00* | (2006.01) | |
| *G06F 13/16* | (2006.01) | |
| *G06F 11/00* | (2006.01) | |
| *G11C 7/10* | (2006.01) | |
| *G06F 11/14* | (2006.01) | |

(52) U.S. Cl.
CPC ......... *G06F 11/14* (2013.01); *G06F 13/1668* (2013.01); *G06F 2212/1024* (2013.01); *G06F 2212/205* (2013.01); *G11C 7/1051* (2013.01); *Y02D 10/00* (2018.01)

(56) References Cited

U.S. PATENT DOCUMENTS

| | | |
|---|---|---|
| 2008/0235444 A1 | 9/2008 | Gower et al. |
| 2010/0070690 A1* | 3/2010 | Amer ............... G06F 3/0611 711/E12.001 |
| 2010/0146333 A1 | 6/2010 | Yong et al. |
| 2012/0317382 A1 | 12/2012 | Steed |
| 2013/0039128 A1 | 2/2013 | Amidi et al. |
| 2013/0282972 A1 | 10/2013 | Nazm Bojnordi et al. |
| 2013/0339589 A1 | 12/2013 | Qawami et al. |
| 2014/0095769 A1 | 4/2014 | Borkenhagen |
| 2014/0195765 A1 | 7/2014 | Abali et al. |
| 2015/0046631 A1 | 2/2015 | Prather |
| 2015/0089164 A1 | 3/2015 | Ware et al. |
| 2015/0149735 A1 | 5/2015 | Nale et al. |
| 2015/0193153 A1 | 7/2015 | Bauman |
| 2015/0207805 A1 | 7/2015 | Blair et al. |
| 2015/0287461 A1 | 10/2015 | Song |
| 2016/0299719 A1 | 10/2016 | Liu et al. |
| 2016/0314822 A1 | 10/2016 | Yeung et al. |
| 2016/0342487 A1 | 11/2016 | Ware et al. |
| 2017/0060706 A1 | 3/2017 | Kinoshita |
| 2017/0075576 A1 | 3/2017 | Cho |
| 2019/0026026 A1 | 1/2019 | Benedict et al. |

* cited by examiner

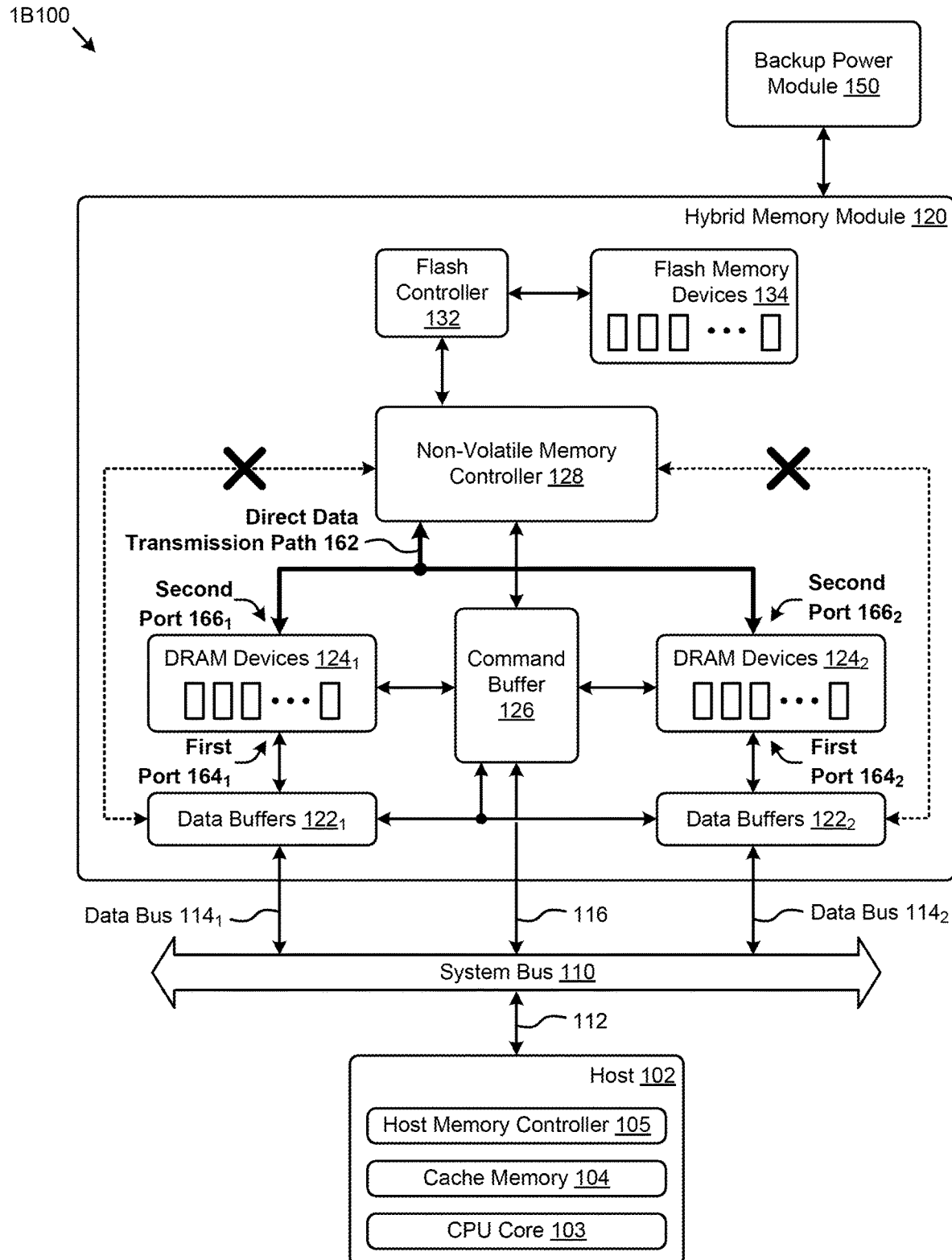
FIG. 1B1

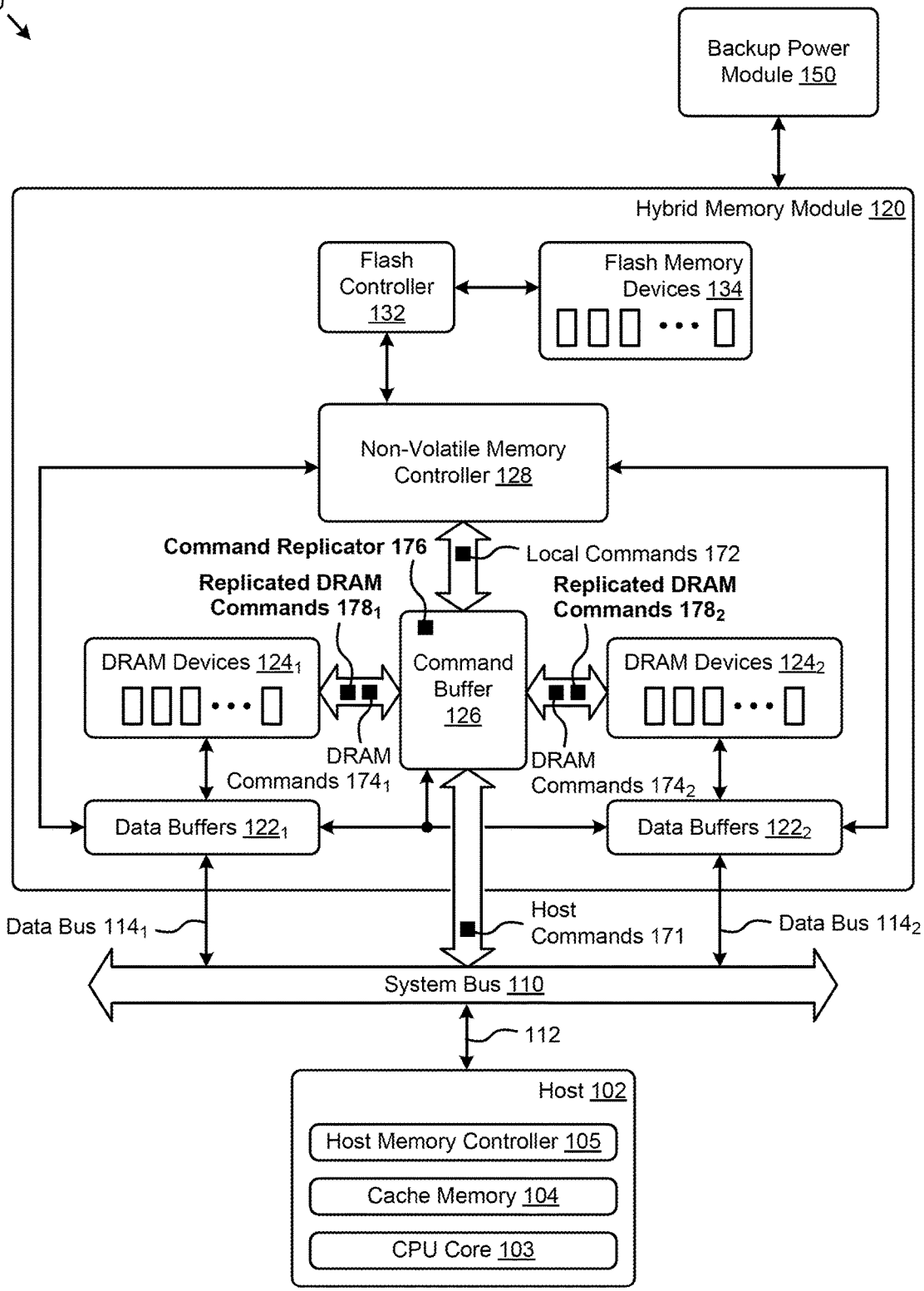
FIG. 1B2

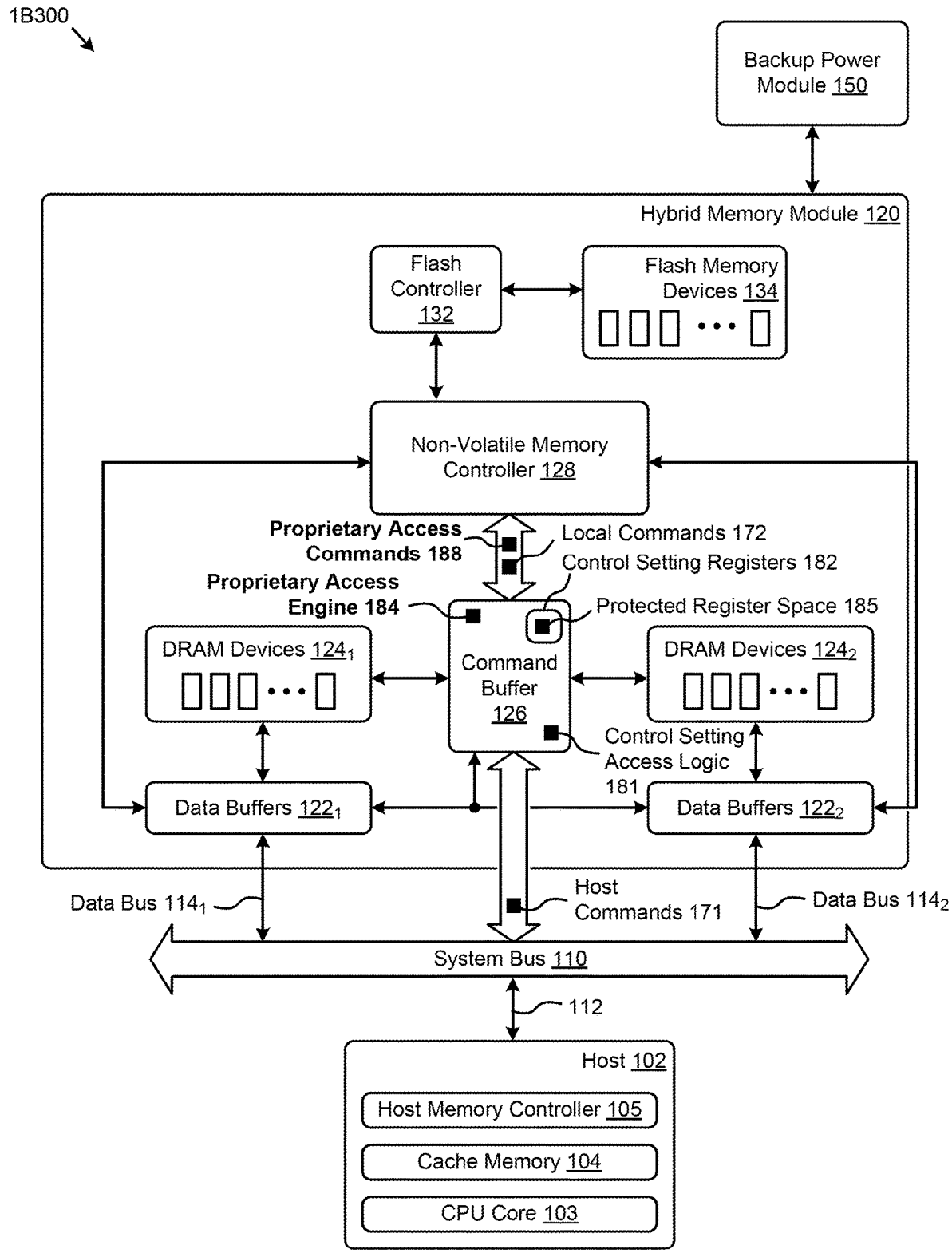
FIG. 1B3

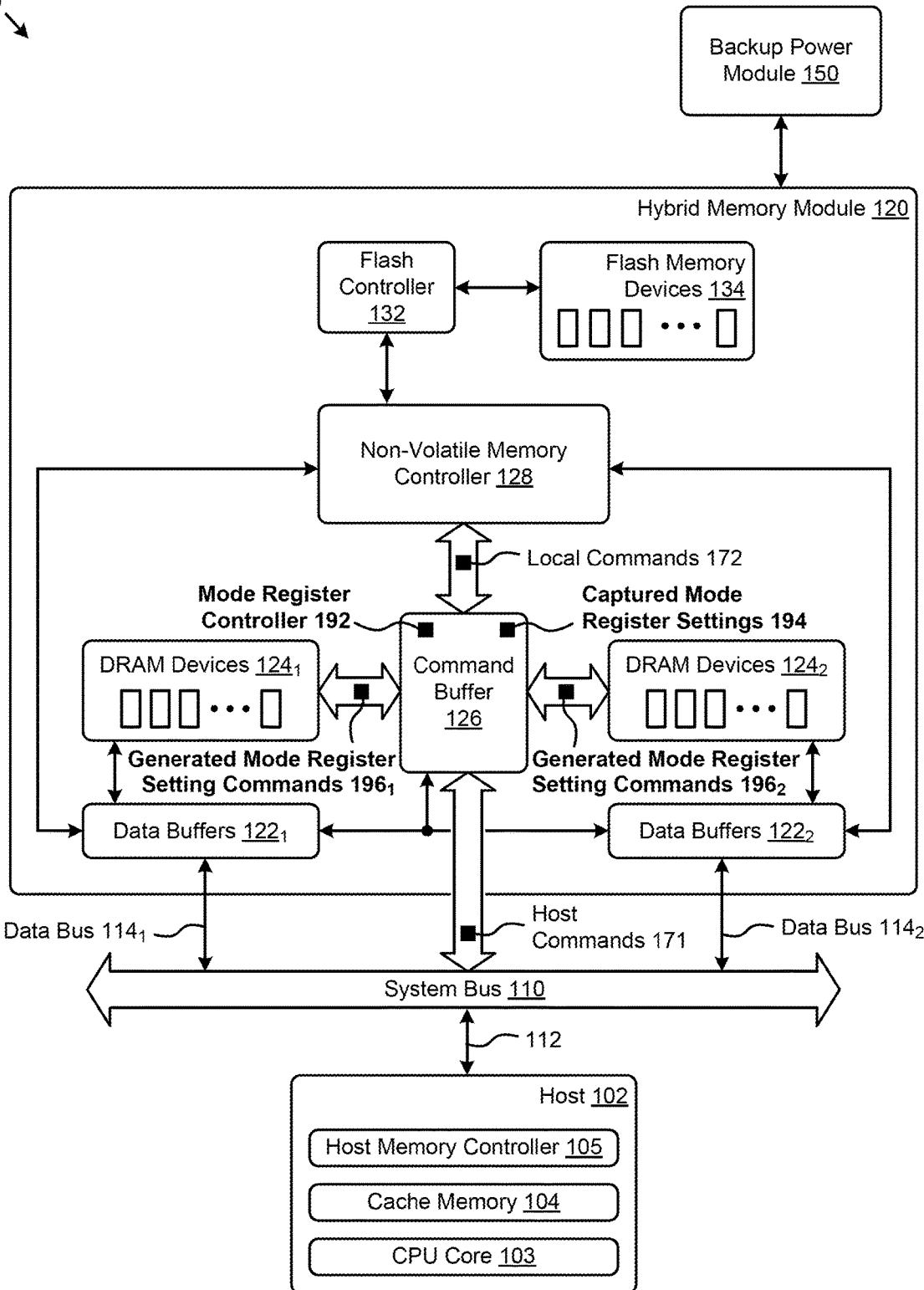
FIG. 1B4

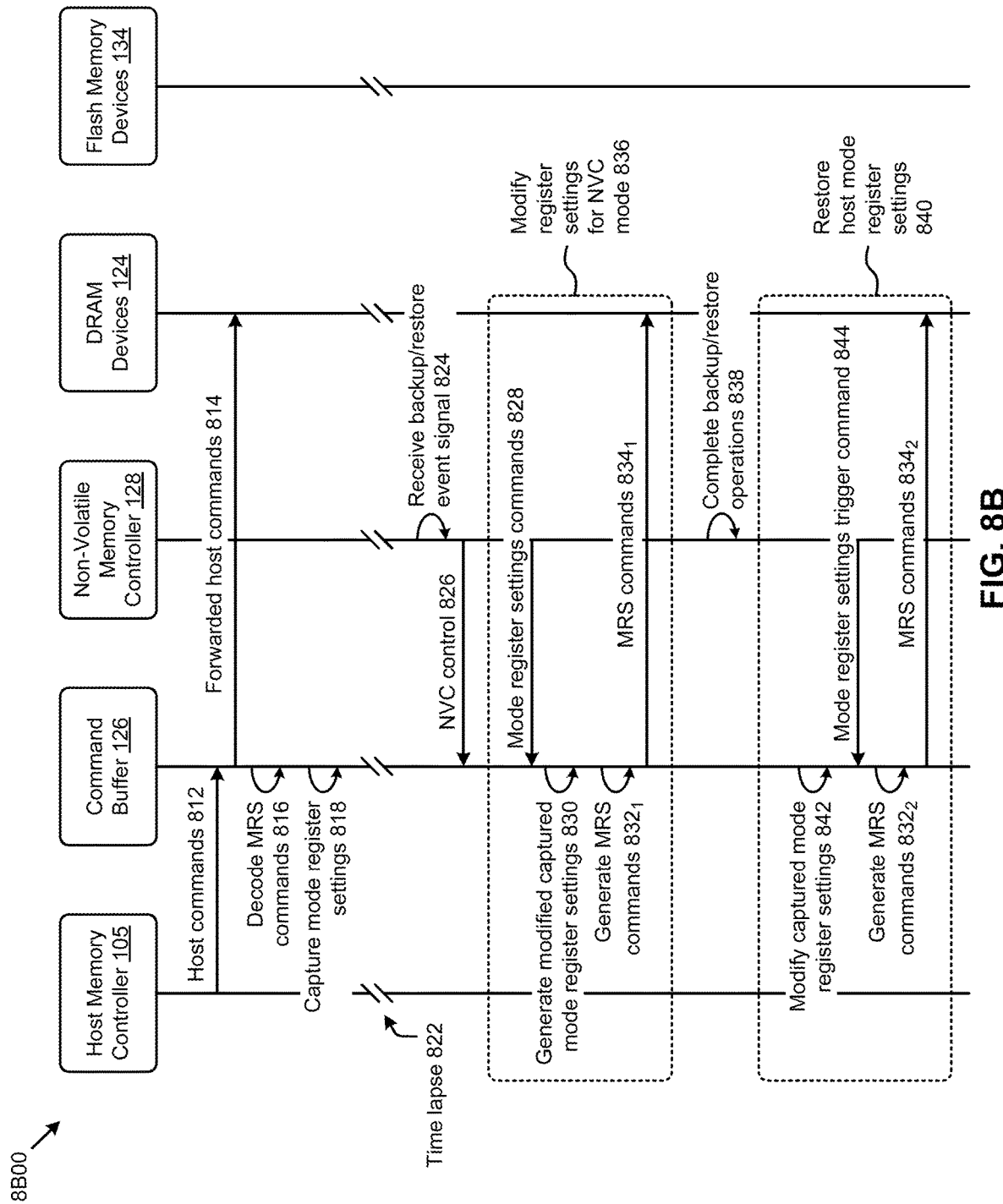

HIGH-THROUGHPUT LOW-LATENCY HYBRID MEMORY MODULE

CROSS REFERENCE PARAGRAPH

This application is a continuation of U.S. application Ser. No. 16/535,814, filed Aug. 8, 2019, which is a continuation of U.S. application Ser. No. 16/042,374, filed Jul. 23, 2018, now U.S. Pat. No. 10,379,752, which is a continuation of U.S. application Ser. No. 14/883,155, filed Oct. 14, 2015, now U.S. Pat. No. 10,031,677, the contents of which are herein incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD

This disclosure relates to the field of memory systems and more particularly to techniques for high-throughput low-latency hybrid memory modules.

BACKGROUND

As the massive volumes of electronically stored and transmitted data (e.g., "big data") continue to increase, so does the need for electronic data storage that is reliable and cost effective, yet quickly accessible (e.g., low latency). Specifically, more computing applications are requiring that increasingly larger data sets be stored in "hot" locations for high speed access. Certain non-volatile memory (NVM) storage technologies, such as magnetic hard disk drives (HDDs), can provide a reliable, low cost storage solution, yet with relatively high access latencies. Such storage technologies might be used for large volumes of data in "cold" locations that are not often accessed (e.g., data warehouses, archives, etc.). Other volatile or "dynamic" memory storage technologies, such as dynamic random access memory (DRAM), provide lower access latencies, and might be used in "hot" locations near a computing host (e.g., CPU) to offer fast access to certain data for processing. Yet, such storage technologies can have a relatively high cost and risk of data loss (e.g., on power loss). Solid state NVM, such as Flash memory, can offer an improved form factor and access latency as compared to an HDD, yet still not approach the access latency of DRAM.

In some cases, DRAM and Flash can be combined in a hybrid memory module to deliver the fast data access of the DRAM and the non-volatile data integrity (e.g., data retention) enabled by the Flash memory. One such implementation is the non-volatile dual in-line memory module (NVDIMM), which stores data in DRAM for normal operation, and stores data in Flash for backup and/or restore operations (e.g., responsive to a power loss, system crash, normal system shutdown, etc.). Specifically, for example, the JEDEC standards organization has defined the NVDIMM-N product for such backup and/or restore applications. Many NVDIMM implementations can further be registered DIMMs (RDIMMs), which can use hardware registers and other logic, such as included in a registering clock driver (RDC), to buffer the address and control signals to the DRAM devices in order to expand the capacity of the memory channels. Other NVDIMM implementations can be load-reduced DIMMs (LRDIMMs), which can include data buffers to buffer the data signals in order to reduce the loading on the data bus and expand the capacity of the memory channels.

Unfortunately, legacy NVDIMM architectures can have functional and performance limitations. Specifically, some NVDIMMs can exhibit throughput limitations associated with the non-volatile memory controller (NVC) communications interface used for DRAM read and write commands during data backup and data restore operations. For example, some NVC communications interface protocols can require 128 DRAM clock cycles per DRAM command (e.g., read, write, etc.) issued from the non-volatile memory controller. Such latencies can affect the throughput of backup and/or restore operations, resulting in high power consumption (e.g., more clock cycles). In some cases, the RDC interface to the NVC (e.g., LCOM interface) and/or the DRAM devices can also limit the options for connecting the DRAM devices to the NVC, resulting in an increased chip layout area and a corresponding increase per chip cost.

Also, some NVDIMMs might restrict non-volatile memory controller (NVC) resource access when in a host control mode. For example, such restrictions might be implemented so as to avoid impacting access to certain resources (e.g., control setting registers) by the host memory controller when in a host control mode. In some cases, the NVC resource access (e.g., read access) can be limited in both the host control mode and an NVC control mode. The foregoing NVC resource access restrictions might cause the NVC to remain idle when it might otherwise be used to reduce the load on the host and/or prepare certain settings in advance of an event (e.g., data backup, data restore, etc.), resulting in decreased power efficiency and/or decreased throughput of the memory system.

In some cases, some NVDIMMs can also exhibit certain functional restrictions, long latencies, and high power consumption when programming certain DRAM device settings in a non-volatile memory controller (NVC) control mode, such as that invoked during data backup and data restore operations. For example, the NVC control mode might require different mode register settings for the DRAM devices as compared to the mode register settings established for the host control mode. In certain NVDIMM implementations, the NVC might have access to only certain bits of the mode register settings established in the host control mode such that any mode register set (MRS) commands issued from the NVC might overwrite certain settings that were desired to remain unchanged. Further, the MRS commands issued from the NVC can comprise extended clock cycles as compared to those issued directly to the DRAM devices, resulting in increased latencies and increased power consumption attributed to the programming of the mode register settings when switching into and out of the NVC control mode.

Techniques are needed to address the problems of:
implementing a hybrid memory module that overcomes the throughput limitations of the NVC communications interface used for DRAM read and write commands during data backup and data restore operations;
implementing a hybrid memory module that expands the NVC resource access, yet does not impact host memory controller resource access, when in a host control mode; and implementing a hybrid memory module that exhibits enhanced programmability of the DRAM mode register settings in an NVC control mode, such as that invoked during data backup and data restore operations.

None of the aforementioned legacy approaches achieve the capabilities of the herein-disclosed techniques, therefore, there is a need for improvements.

SUMMARY

The present disclosure provides an improved method, system, and computer program product suited to address the aforementioned issues with legacy approaches. Specifically, the present disclosure provides a detailed description of techniques used in implementing a high-throughput low-latency hybrid memory module.

More specifically, the present disclosure provides a detailed description of techniques for implementing a hybrid memory module with improved data backup and restore throughput. The claimed embodiments address the problem of implementing a hybrid memory module that overcomes the throughput limitations of the NVC communications interface used for DRAM read and write commands during data backup and data restore operations. Some embodiments of the present disclosure are directed to approaches for providing a command replicator to generate command sequences comprising replicated DRAM commands to be issued by a command buffer to a set of DRAM devices. In one or more embodiments, the command sequence is based on local commands received by the command buffer from an NVC (e.g., during an NVC control mode). In one or more embodiments, the replicated DRAM commands can access one or more memory locations (e.g., sides, ranks, bytes, nibbles, etc.) of the DRAM devices. Also, in other embodiments, the command sequence can comprise sets of replicated DRAM commands that access respective portions of the DRAM devices (e.g., two sets of commands to access two groups of DRAM devices sharing a connection).

The present disclosure also provides a detailed description of techniques for implementing a hybrid memory module with enhanced non-volatile memory controller (NVC) resource access. The claimed embodiments address the problem of implementing a hybrid memory module that expands the NVC resource access, yet does not impact host memory controller resource access, when in a host control mode. Some embodiments of the present disclosure are directed to approaches for providing a proprietary access engine to interpret proprietary access commands from the NVC while in a host control mode to access a protected register space that is not architected to be accessible in the host control mode. In one or more embodiments, the proprietary access commands are interpreted when a proprietary mode has been triggered. In one or more embodiments, the proprietary access engine comprises an access arbiter to allow access to the protected register space by only one of NVC and a host controller at a given time.

The present disclosure further provides a detailed description of techniques for implementing a hybrid memory module with enhanced mode register setting programmability. The claimed embodiments address the problem of implementing a hybrid memory module that exhibits enhanced programmability of the DRAM mode register settings in an NVC control mode, such as that invoked during data backup and data restore operations. Some embodiments of the present disclosure are directed to approaches for providing a mode register controller to capture (e.g., "snoop") a set of captured mode register settings from host commands received from a host memory controller, then generate certain generated mode register setting commands based on the captured mode register settings. In one or more embodiments, the generated mode register setting commands can be issued to the DRAM devices by a command buffer responsive to receiving certain local commands from an NVC. In some embodiments, the captured mode register settings can be modified to produce a set of modified captured mode register settings to be used to generate the generated mode register setting commands.

Further details of aspects, objectives, and advantages of the disclosure are described below and in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

The drawings described below are for illustration purposes only. The drawings are not intended to limit the scope of the present disclosure.

FIG. 1B1 is a diagrammatic representation of a direct data path technique for improving data transmission throughput for data backup and restore in hybrid memory modules, according to an embodiment.

FIG. 1B2 is a diagrammatic representation of a command replication technique for improving data backup and restore throughput in hybrid memory modules, according to an embodiment.

FIG. 1B3 is a diagrammatic representation of a proprietary access technique for enhancing non-volatile memory controller resource access in hybrid memory modules, according to an embodiment.

FIG. 1B4 is a diagrammatic representation of a mode register setting snooping technique for enhancing the programmability of the DRAM mode register settings in a non-volatile memory controller control mode, according to an embodiment.

FIG. 8B is a diagram showing interactions in hybrid memory modules that implement a mode register controller for enhancing the programmability of the DRAM mode register settings in a non-volatile memory controller control mode, according to some embodiments.

DETAILED DESCRIPTION

Figure 1A:
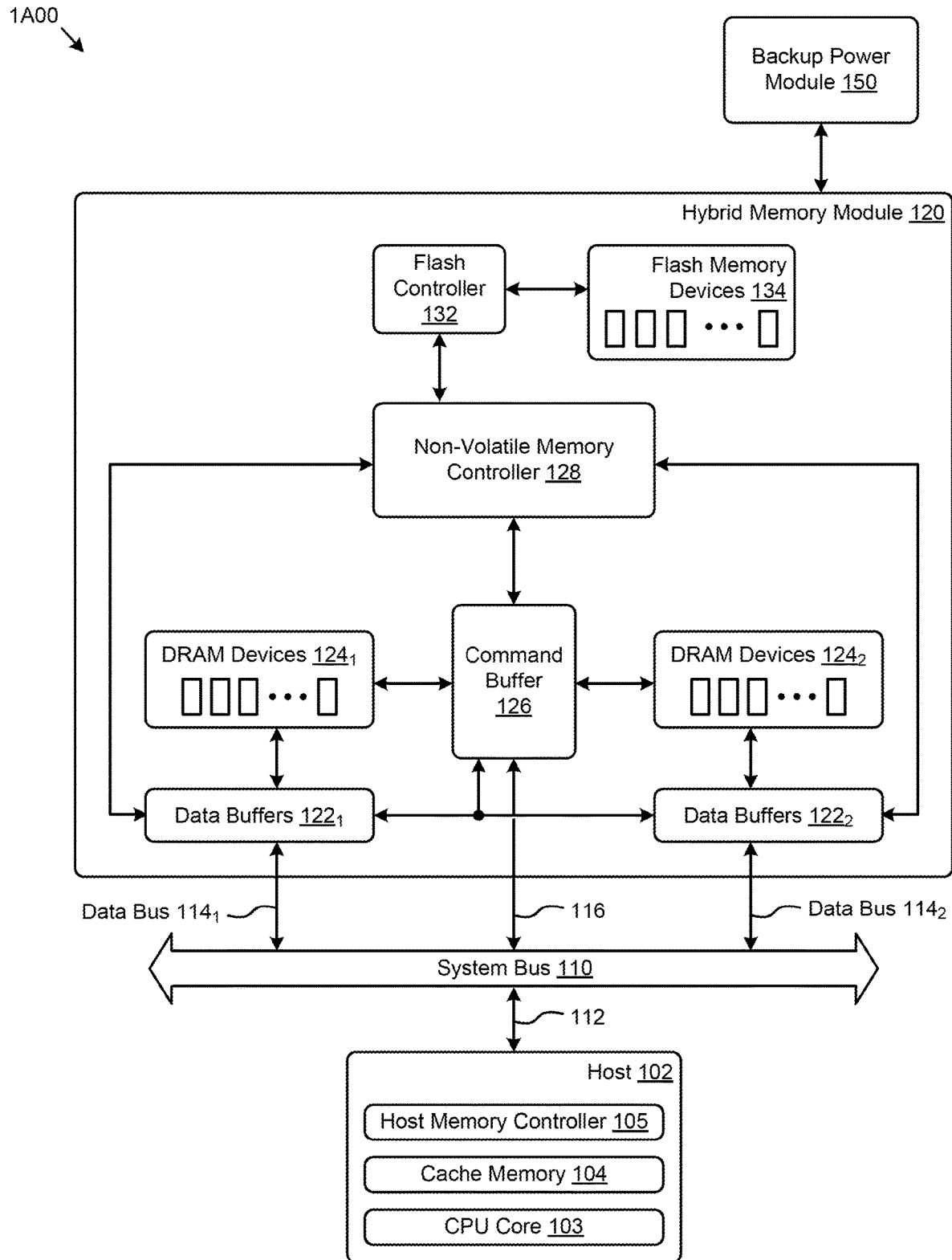
FIG. 1A depicts an environment showing a hybrid memory module.

Embodiments of the present disclosure address problems attendant to electronic data storage subsystem architectures (e.g., memory modules) that are exhibited in situations such as during backup and restore operations.

OVERVIEW

Addressed herein are figures and discussions that teach:

How to implement a command replicator in a hybrid memory module to generate sequences of one or more DRAM read and/or write and/or other commands to be executed in response to certain local non-volatile memory controller (NVC) commands invoked during data backup and data restore operations;

How to implement a proprietary access engine in a hybrid memory module to enable a non-volatile memory controller (NVC) in a host control mode to trigger a proprietary mode and issue commands to be interpreted by a set of proprietary control setting access logic for access by the NVC to a protected register space; and How to implement a mode register controller in a hybrid memory module to capture and store the data comprising mode register setting (MRS) commands issued to DRAM mode registers during a host control mode, such that a non-volatile memory controller (NVC) can program the DRAM mode registers in an NVC control mode.

More particularly, disclosed herein and in the accompanying figures are exemplary environments, methods, and systems for high-throughput low-latency hybrid memory modules.

Definitions

Some of the terms used in this description are defined below for easy reference. The presented terms and their respective definitions are not rigidly restricted to these definitions—a term may be further defined by the term's use within this disclosure.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances.

The articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

DESCRIPTIONS OF EXEMPLARY EMBODIMENTS

FIG. 1A depicts an environment 1A00 showing a hybrid memory module. As an option, one or more instances of environment 1A00 or any aspect thereof may be implemented in the context of the architecture and functionality of the embodiments described herein. Also, the environment 1A00 or any aspect thereof may be implemented in any desired environment.

As shown in FIG. 1A, environment 1A00 comprises a host 102 coupled to a hybrid memory module 120 through a system bus 110. The host 102 further comprises a CPU core 103, a cache memory 104, and a host memory controller 105. Host 102 can comprise multiple instances each of CPU core 103, cache memory 104, and host memory controller 105. The host 102 of environment 1A00 can further be based on various architectures (e.g., Intel x86, ARM, MIPS, IBM Power, etc.). Cache memory 104 can be dedicated to the CPU core 103 or shared with other cores. The host memory controller 105 of the host 102 communicates with the hybrid memory module 120 through the system bus 110 using a physical interface 112 (e.g., compliant with the JEDEC DDR4 SDRAM standard, etc.). Specifically, the host memory controller 105 can write data to and/or read data from a first set of DRAM devices $124_1$ and a second set of DRAM devices $124_2$ using a data bus $114_1$ and a data bus $114_2$, respectively. For example, the data bus $114_1$ and the data bus $114_2$ can transmit the data as electronic signals such as a data signal, a chip select signal, or a data strobe signal. The DRAM devices $124_1$ and/or the DRAM devices $124_2$ might each comprise an array of eight or nine DDR4 memory devices (e.g., SDRAM) arranged in various topologies (e.g., A/B sides, single-rank, dual-rank, quad-rank, etc.). Other memory devices (e.g., DDR3 memory devices) can comprise the DRAM devices. In some cases, as shown, the data to and/or from the DRAM devices $124_1$ and the DRAM devices $124_2$ can be buffered by a set of data buffers $122_1$ and data buffers $122_2$, respectively. Such data buffers can serve to boost the drive of the signals (e.g., data or DQ signals, etc.) on the system bus 110 to help mitigate high electrical loads of large computing and/or memory systems.

Further, commands from the host memory controller 105 can be received by a command buffer 126 (e.g., registering clock driver or RCD) at the hybrid memory module 120 using a command and address (CA) bus 116. For example, the command buffer 126 might be a registering clock driver (RCD) such as included in registered DIMMs (e.g., RDIMMs, LRDIMMs, etc.). Command buffers such as command buffer 126 can comprise a logical register and a phase-lock loop (PLL) to receive and re-drive command and address input signals from the host memory controller 105 to the DRAM devices on a DIMM (e.g., DRAM devices $124_1$, DRAM devices $124_2$, etc.), reducing clock, control, command, and address signal loading by isolating the DRAM devices from the host memory controller 105 and the system bus 110. In some cases, certain features of the command buffer 126 can be programmed with configuration and/or control settings.

The hybrid memory module 120 shown in FIG. 1A further comprises a non-volatile memory controller 128 coupled to a flash controller 132 and a set of flash memory devices 134. The presence of the flash memory devices 134 (e.g., NAND flash memory chips) and the DRAM devices on a dual in-line memory module (DIMM), in part, defines the "hybrid" characteristic of the hybrid memory module 120, at least according to JEDEC. Such hybrid memory modules can be referred to as non-volatile DIMMs (NVDIMMs), and can appear as a DRAM DIMM to the system controller (e.g., host memory controller 105) and/or share a memory channel with other DRAM DIMMs. For example, JEDEC has identified three NVDIMM configurations as follows:

NVDIMM-N: A hybrid memory module consisting of DRAM made persistent through the use of Flash memory. No Flash memory beyond that needed for persistence operations (e.g., data backup, data restore, etc.) is accessible by the host memory controller.
  NVDIMM-P: A hybrid memory module consisting of DRAM made persistent through the use of Flash memory. Flash memory beyond that needed for persistence is accessible by the host memory controller as a block-oriented mass storage device.
  NVDIMM-F: A hybrid memory module consisting of Flash memory accessed by the host memory controller as a block-oriented mass storage device.

The hybrid memory module 120 shown in environment 1A00 can be considered an NVDIMM-N configuration. As such, a backup power module 150 is shown coupled to the hybrid memory module 120 to deliver power to the hybrid memory module 120 during persistence operations such as data backup and data restore in the event of a system power loss. For example, the backup power module 150 might comprise super capacitors (e.g., supercaps) and/or battery packs attached to the hybrid memory module 120 via a tether cable and store enough charge to keep at least a portion of the hybrid memory module 120 powered up long enough to copy all of its data from the DRAM to the flash memory.

Further, the hybrid memory module 120 shown in environment 1A00 presents merely one partitioning. The specific example shown where the command buffer 126, the non-volatile memory controller 128, and the flash controller 132 are separate components is purely exemplary, and other partitioning is reasonable. For example, any or all of the components comprising the hybrid memory module 120 and/or other components can comprise one device (e.g., system-on-chip or SoC), multiple devices in a single package or printed circuit board, multiple separate devices, and can have other variations, modifications, and alternatives.

Unfortunately, legacy NVDIMM architectures can have functional and performance limitations. Specifically, some NVDIMMs can exhibit long latencies and low throughput during certain operations, such as those pertaining to data backup and/or data restore operations. The herein disclosed techniques address such limitations and other legacy issues as described in the following and throughout.

FIG. 1B1 is a diagrammatic representation of a direct data path technique 1B100 for improving data transmission throughput for data backup and restore in hybrid memory modules. As an option, one or more instances of direct data path technique 1B100 or any aspect thereof may be implemented in the context of the architecture and functionality of the embodiments described herein. Also, the direct data path technique 1B100 or any aspect thereof may be implemented in any desired environment.

As shown in FIG. 1B1, the direct data path technique 1B100 is depicted in the environment 1A00 comprising the hybrid memory module 120. The direct data path technique 1B100 can address the problems attendant to implementing a hybrid memory module that exhibits improved transmission latencies and power consumption when transmitting data between the module DRAM devices and the module NVM devices during data backup and data restore operations. Specifically, in some embodiments, the direct data path technique 1B100 comprises a direct data transmission path 162 coupling the non-volatile memory controller 128 and the DRAM devices $124_1$ and the DRAM devices $124_2$. The non-volatile memory controller 128 can use the direct data transmission path 162 to transmit data between the DRAM devices and the flash memory devices 134, eliminating the need for a path coupling the data buffers (e.g., data buffers $122_1$, data buffers $122_2$) and the non-volatile memory controller 128. In some embodiments, the DRAM devices can be port switched devices, each comprising a first port (e.g., first port $164_1$, first port $164_2$) coupled to the data bus (e.g., data bus $114_1$, data bus $114_2$), and a second port (e.g., second port $166_1$, second port $166_2$) coupled to the direct data transmission path 162, such that the first port is disabled and the second port is enabled when transmitting data between the DRAM devices and the flash memory devices. Further, in one or more embodiments, the data buffers (e.g., data buffers $122_1$, data buffers $122_2$) can be disabled when transmitting data between the DRAM devices and the flash memory devices.

FIG. 1B2 is a diagrammatic representation of a command replication technique 1B200 for improving data backup and restore throughput in hybrid memory modules. As an option, one or more instances of command replication technique 1B200 or any aspect thereof may be implemented in the context of the architecture and functionality of the embodiments described herein. Also, the command replication technique 1B200 or any aspect thereof may be implemented in any desired environment.

As shown in FIG. 1B2, the command replication technique 1B200 is depicted in the environment 1A00 comprising the hybrid memory module 120. The command replication technique 1B200 can address the problems attendant to implementing a hybrid memory module that overcomes the throughput limitations of the non-volatile memory controller (NVC) communications interface used for DRAM read and write commands during data backup and data restore operations. Specifically, in some embodiments, the command buffer 126 can receive host commands 171 from the host memory controller 105, receive local commands 172 from the non-volatile memory controller 128, and issue DRAM commands (e.g., DRAM commands $174_1$, DRAM commands $174_2$) to the DRAM devices (e.g., DRAM devices $124_1$, DRAM devices $124_2$). Further, the command replication technique 1B200 can comprise a command replicator 176 (e.g., implemented in the command buffer 126) to generate command sequences comprising replicated DRAM commands (e.g., replicated DRAM commands $178_1$, replicated DRAM commands $178_2$) to be issued by the command buffer 126 to the DRAM devices. In one or more embodiments, the command sequence is based at least in part on the local commands 172 received by the command buffer 126 (e.g., during an NVC control mode).

In some embodiments, the command sequence is issued to the DRAM devices by the command buffer 126 responsive to receiving one or more instances of the local commands 172. In one or more embodiments, the command sequence can comprise wait times between the replicated DRAM commands. Further, in some embodiments, the replicated DRAM commands can access one or more memory locations (e.g., sides, ranks, bytes, nibbles, etc.) of the DRAM devices. Also, in other embodiments, the command sequence can comprise sets of replicated DRAM commands that access respective portions of the DRAM devices (e.g., two sets of commands to access two groups of DRAM devices sharing a connection).

FIG. 1B3 is a diagrammatic representation of a proprietary access technique 1B300 for enhancing non-volatile memory controller resource access in hybrid memory modules. As an option, one or more instances of proprietary access technique 1B300 or any aspect thereof may be implemented in the context of the architecture and functionality of the embodiments described herein. Also, the proprietary access technique 1B300 or any aspect thereof may be implemented in any desired environment.

As shown in FIG. 1B3, the proprietary access technique 1B300 is depicted in the environment 1A00 comprising the hybrid memory module 120. The proprietary access technique 1B300 can address the problems attendant to implementing a hybrid memory module that expands the non-volatile memory controller (NVC) resource access, yet does not impact host memory controller resource access, when in a host control mode. Specifically, in some embodiments, the command buffer 126 can receive host commands 171 from the host memory controller 105, and receive local commands 172 from the non-volatile memory controller 128. In some cases, such commands are interpreted by a set of control setting access logic 181 to access a set of control setting registers 182 that hold certain instances of control settings (e.g., used to adjust certain characteristics of the command buffer 126). Further, the control setting registers 182 can comprise a protected register space 185 not accessible by the non-volatile memory controller 128 in the host control mode.

In one or more embodiments, the proprietary access technique 1B300 comprises a proprietary access engine 184 to interpret one or more proprietary access commands 188 from the non-volatile memory controller 128 to access the protected register space 185 while still in the host control mode. In one or more embodiments, the proprietary access engine 184 comprises a set of proprietary control setting access logic based in part on the control setting access logic 181 to interpret the proprietary access commands 188 to write to and/or read from the protected register space 185. In one or more embodiments, the proprietary access engine 184 comprises a command router to route the local commands 172 to the control setting access logic 181 and route the proprietary access commands 188 to the proprietary control setting access logic. In one or more embodiments, the proprietary access commands 188 are routed to the proprietary control setting access logic based at least in part on a proprietary mode triggered by a sequence of local commands. Further, in some embodiments, the proprietary access engine 184 comprises an access arbiter to allow access to the protected register space 185 invoked by the host commands 171 and/or the proprietary access commands 188.

FIG. 1B4 is a diagrammatic representation of a mode register setting snooping technique 1B400 for enhancing the programmability of the DRAM mode register settings in a non-volatile memory controller control mode. As an option, one or more instances of mode register setting snooping technique 1B400 or any aspect thereof may be implemented in the context of the architecture and functionality of the embodiments described herein. Also, the mode register setting snooping technique 1B400 or any aspect thereof may be implemented in any desired environment.

As shown in FIG. 1B4, the mode register setting snooping technique 1B400 is depicted in the environment 1A00 comprising the hybrid memory module 120. The mode register setting snooping technique 1B400 can address the problems attendant to implementing a hybrid memory module that exhibits enhanced programmability of the DRAM mode register settings in a non-volatile memory controller control mode (e.g. NVC control mode), such as when invoked for data backup and data restore operations. Specifically, in some embodiments, the command buffer 126 can receive host commands 171 from the host memory controller 105, receive local commands 172 from the non-volatile memory controller 128, and issue DRAM commands to the DRAM devices (e.g., DRAM devices $124_1$, DRAM devices $124_2$). For example, such DRAM commands can be mode register setting (MRS) commands issued by the host memory controller 105 (e.g., during host control mode) and/or by the non-volatile memory controller 128 (e.g., during NVC control mode). Further, the mode register setting snooping technique 1B400 can comprise a mode register controller 192 to capture (e.g., "snoop") a set of captured mode register settings 194 from the host commands 171 and generate certain generated mode register setting commands (e.g., generated mode register setting commands $196_1$, generated mode register setting commands $196_2$) based on the captured mode register settings 194. In one or more embodiments, the generated mode register setting commands can be issued to the DRAM devices by the command buffer 126 responsive to receiving certain instances of the local commands 172. In some embodiments, the captured mode register settings 194 can be modified to produce one or more modified captured mode register settings to be used to generate the generated mode register setting commands.

Further details pertaining the aforementioned techniques for high-throughput low-latency hybrid memory modules are disclosed in the following and herein.

Figure 2A:
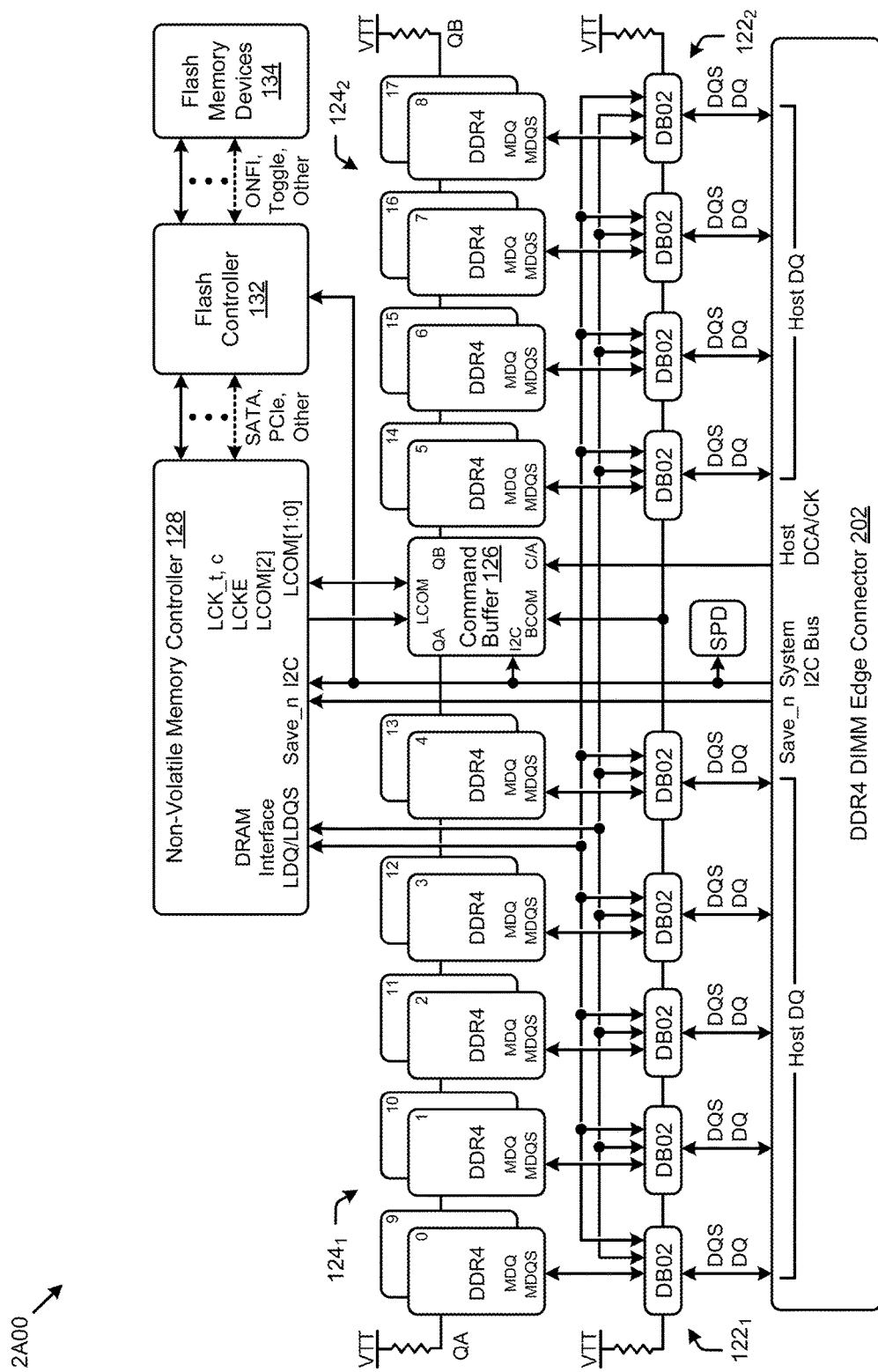
FIG. 2A is a schematic of a hybrid memory module.

FIG. 2A is a schematic of a hybrid memory module 2A00. As an option, one or more instances of hybrid memory module 2A00 or any aspect thereof may be implemented in the context of the architecture and functionality of the embodiments described herein. Also, the hybrid memory module 2A00 or any aspect thereof may be implemented in any desired environment.

The hybrid memory module 2A00 is one example of an NVDIMM configuration. Specifically, the DRAM devices of the hybrid memory module 2A00 comprise 18 DDR4 devices (e.g., ten instances of DRAM devices $124_1$ and eight instances of DRAM devices $124_2$) having data signals (e.g., DQ, DQS, etc.) delivered to a DDR4 DIMM edge connector 202 through a plurality of data buffers (e.g., five instances of data buffers $122_1$ and four instances of data buffers $122_2$). In some cases, two DDR4 devices can share the high bit rate MDQ/MDQS signal connections to a respective data buffer (e.g., DB02 device) in a parallel configuration. Further, a first portion of the DDR4 devices (e.g., DDR4-0 to DDR4-4, and DDR4-9 to DDR4-13) can comprise an A-side of the DRAM configuration, and a second portion of the DDR4 devices (e.g., DDR4-5 to DDR4-8 and DDR4-14 to DDR4-17) can comprise a B-side of the DRAM configuration. In some cases, such configurations can be detected by a serial presence detector or SPD at module initialization. The non-volatile memory controller 128 can further have access to the DDR4 device data signals through an LDQ/LDQS path between the data buffers and the "DRAM Interface" of the non-volatile memory controller 128.

As shown, the command buffer 126 can receive commands, addresses, and other information through the DDR4 DIMM edge connector 202 at an input command/address or C/A interface. The command buffer 126 can further communicate (e.g., receive local commands) with the non-volatile memory controller 128 using a local communications interface supporting a physical layer communications protocol such as the LCOM interface protocol defined by JEDEC. The command buffer 126 can communicate (e.g., forward DRAM commands) with the DDR4 devices using an output control/address/command interface (e.g., see the QA output signals for communicating with the A-side, and the QB output signals for communicating with the B-side). In some cases, the command buffer 126 can also communicate (e.g., send control setting commands) with the data buffers using a data buffer control/communication or BCOM interface. Other signals shown in FIG. 2A include those pertaining to the I2C serial bus and the Save_n memory system signal (e.g., for invoking a backup operation at power loss).

Figure 2B:
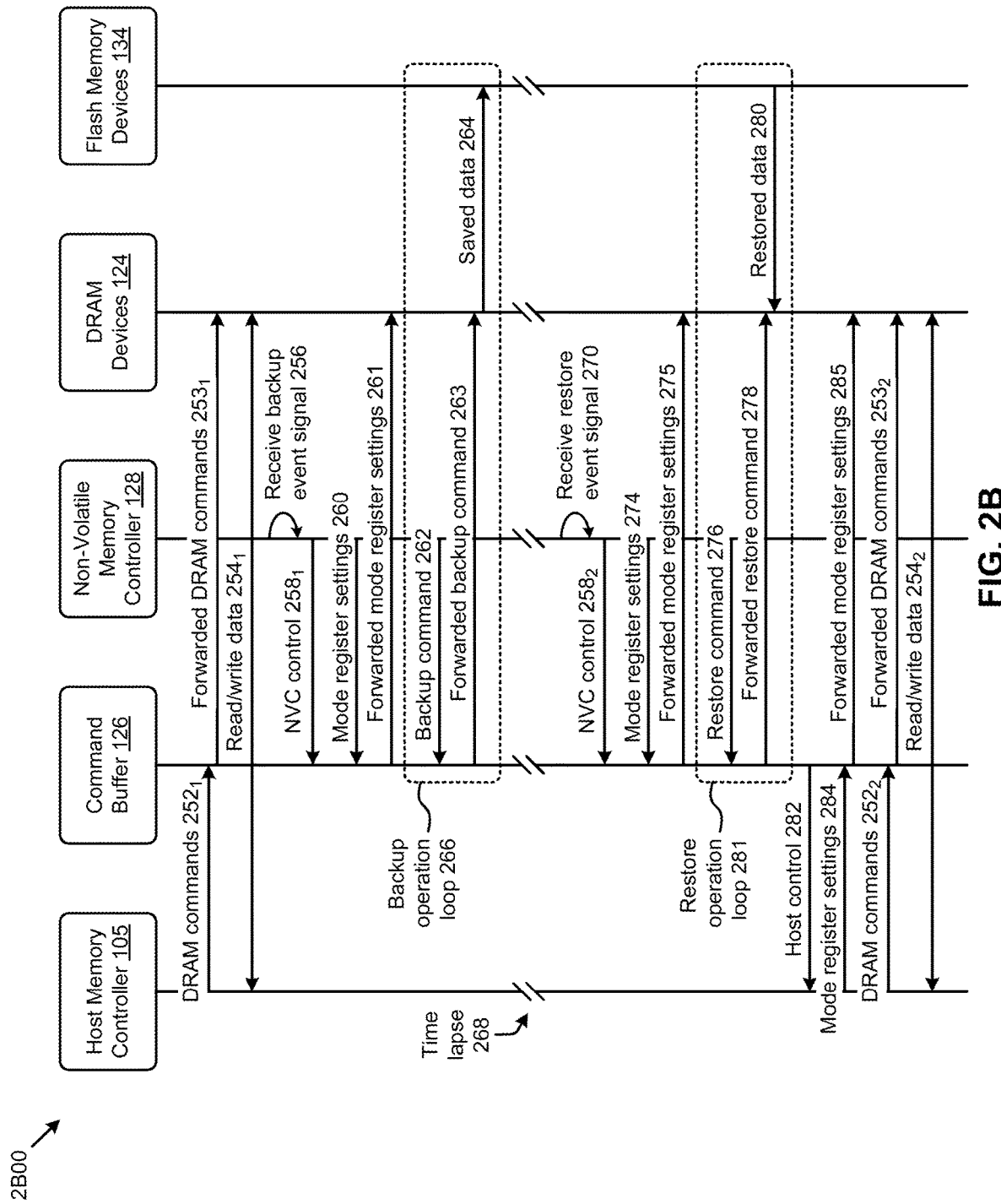
FIG. 2B is a diagram showing interactions among hybrid memory module components pertaining to backup and restore events.

The foregoing signals, interfaces, connections, and other components of the hybrid memory module 2A00 can be used to execute backup and restore operations as discussed in FIG. 2B.

FIG. 2B is a diagram showing interactions among hybrid memory module components 2B00 pertaining to backup and restore events. As an option, one or more instances of interactions among hybrid memory module components 2B00 or any aspect thereof may be implemented in the context of the architecture and functionality of the embodiments described herein. Also, the interactions among hybrid memory module components 2B00 or any aspect thereof may be implemented in any desired environment.

As shown in FIG. 2B, the interactions among hybrid memory module components 2B00 specifically pertain to interactions among the earlier described components comprising the host memory controller 105, the command buffer 126, the non-volatile memory controller 128, the collective set of DRAM devices 124, and the flash memory devices 134. Such components can exhibit a set of high-level interactions (e.g., operations, messages, etc.) as shown. Specifically, the interactions can pertain to backup and restore operations executed on a hybrid memory module. As shown, the host memory controller 105 might have control (e.g., in a host control mode) so as to issue DRAM commands to the command buffer 126 (see message $252_1$) that might be forwarded to the DRAM devices 124 (see message $253_1$). In some cases, the DRAM commands can result in read and/or write data transferred between the host memory controller 105 and the DRAM devices 124 (see message $254_1$).

Such activity might continue until a data backup event signal is received at the non-volatile memory controller 128 (see operation 256). For example, the host and/or the hybrid memory module might have detected the loss of power and triggered the data backup event. Such backup events can be invoked at the non-volatile memory controller 128 from the host memory controller 105 (e.g., via the command buffer 126), from the Save_n signal, and from the I2C bus. In response, control can be provisioned to the non-volatile memory controller 128 by, for example, writing to certain control register settings of the command buffer 126 (see message $258_1$). The backup operation might then commence with the non-volatile memory controller 128 sending new mode register settings (e.g., specific to the backup operation) to the command buffer 126 (see message 260) that can be forwarded to the DRAM devices 124 (see message 261). The non-volatile memory controller 128 can then begin to issue backup commands to the command buffer 126 (see message 262) that can be forwarded to the DRAM devices 124 (see message 263) to save data from the DRAM devices 124 to the flash memory devices 134 (see message 264). Such backup interactions can continue in a loop (see loop 266) until the backup operation is complete (e.g., all data is saved).

After a time lapse 268, a data restore event signal might be received by the non-volatile memory controller 128 (see operation 270). For example, the line power to the computing system might have returned to trigger the data restore event. In response, control can be provisioned to the non-volatile memory controller 128 by, for example, writing to certain control register settings of the command buffer 126 (see message $258_2$). The restore operation might commence with the non-volatile memory controller 128 sending new mode register settings (e.g., specific to the restore operation) to the command buffer 126 (see message 274) that can be forwarded to the DRAM devices 124 (see message 275). The non-volatile memory controller 128 can then begin to issue restore commands to the command buffer 126 (see message 276) that can be forwarded to the DRAM devices 124 (see message 278) to restore data from the flash memory devices 134 to the DRAM devices 124 (see message 280). Such restore interactions can continue in a loop (see loop 281) until the restore operation is complete (e.g., all data is restored).

When the restore is complete, the command buffer 126 can provision control to the host memory controller 105 (see message 282). The host memory controller 105 might then initialize the host control session by sending new mode register settings (e.g., specific to host operations) to the command buffer 126 (see message 284) that can be forwarded to the DRAM devices 124 (see message 285). The host memory controller 105 can then resume memory access operations by issuing DRAM commands to the command buffer 126 (see message 252$_2$) to be forwarded to the DRAM devices 124 (see message 253$_2$) to invoke, in some cases, the transfer of read and/or write data between the host memory controller 105 and the DRAM devices 124 (see message 254$_2$).

The hybrid memory module 2A00 and the interactions among hybrid memory module components 2B00 exemplify various limitations addressed by the herein disclosed techniques. Specifically, FIG. 3B describes the herein disclosed for improving (e.g., as compared to FIG. 3A) transmission latencies and power consumption when transmitting data between the DRAM devices and the flash memory devices during data backup and data restore operations.

Figure 3A:
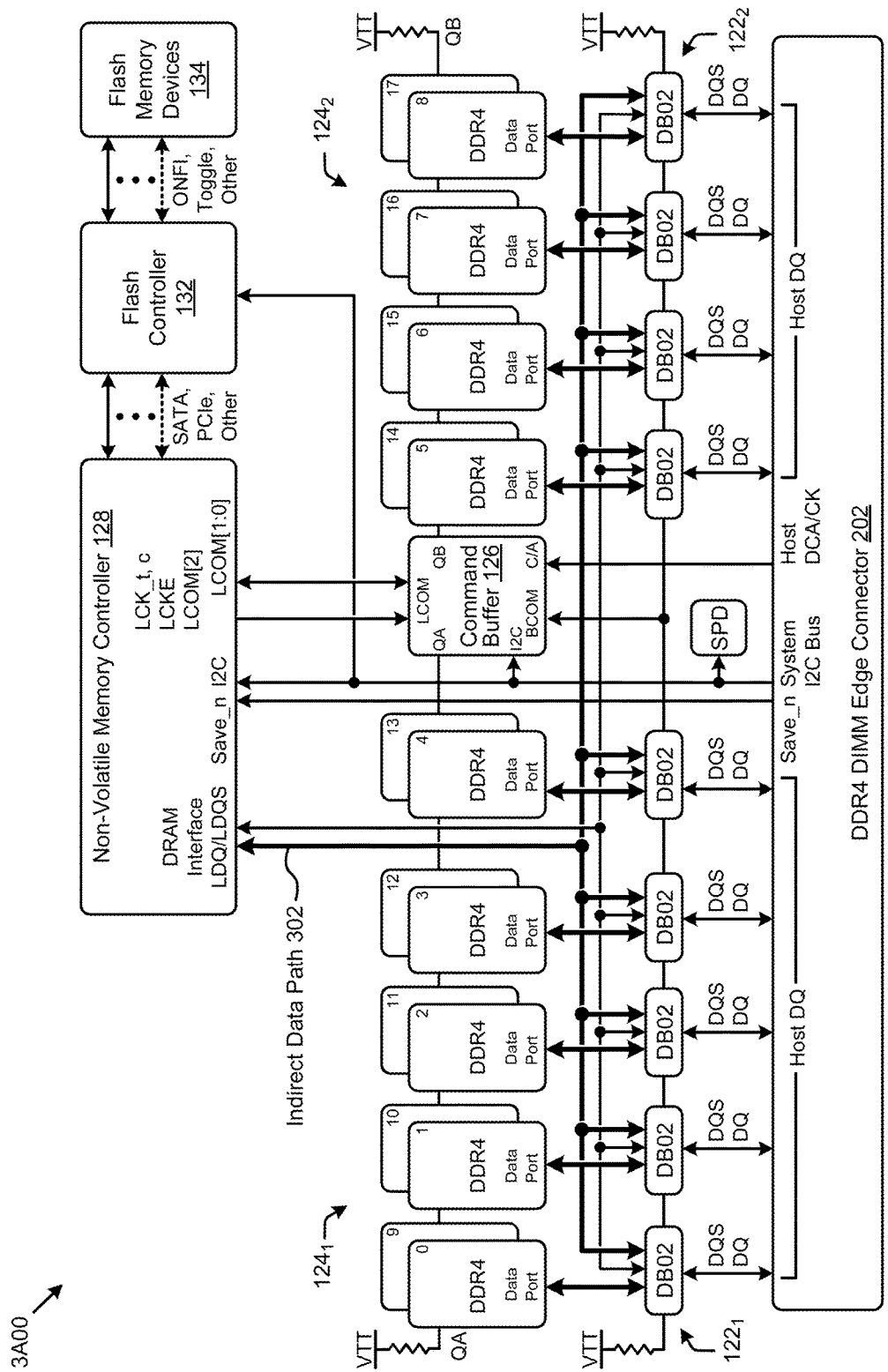
FIG. 3A is a schematic of hybrid memory module components showing an indirect data transmission path used for data backup and restore.

FIG. 3A is a schematic of hybrid memory module components 3A00 showing an indirect data transmission path used for data backup and restore. As an option, one or more instances of hybrid memory module components 3A00 or any aspect thereof may be implemented in the context of the architecture and functionality of the embodiments described herein. Also, the hybrid memory module components 3A00 or any aspect thereof may be implemented in any desired environment.

FIG. 3A shows the hybrid memory module 2A00 comprising a highlighted instance of an indirect data path 302 used for data backup and data restore operations. As shown, the indirect data path 302 requires that data from the DRAM devices (e.g., DDR4 devices) be routed through the data buffers (e.g., DB02 devices) to the DRAM interface of the non-volatile memory controller 128 during backup and restore. The indirect data path 302 comprises two segments: the MDQ/MDQS high bit rate host path between the DRAM devices and the data buffers, and the low bit rate LDQ/LDQS path between the data buffers and the DRAM interface of the non-volatile memory controller 128. Such an indirect data path 302 requires that the DRAM devices, the command buffer 126, and the data buffers run at the high bit rate of the host path, consuming unnecessary power. Further, such components might also need to rely on the host training settings to comply with signal timing requirements. The foregoing issues pertaining to the indirect data path 302 are addressed by the herein disclosed techniques as described in FIG. 3B.

Figure 3B:
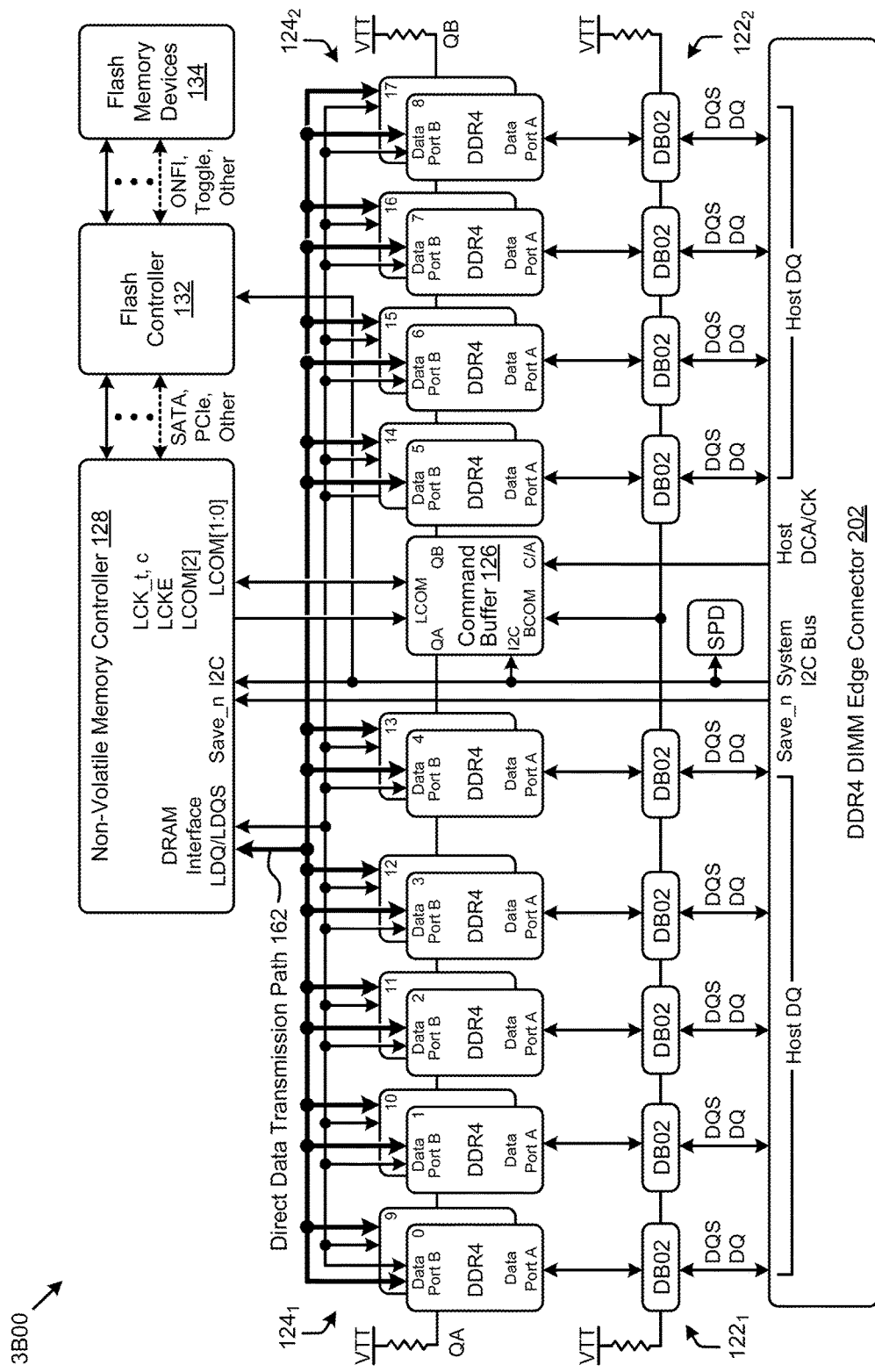
FIG. 3B is a schematic of a hybrid memory module showing a direct data transmission path used for improving transmission latencies and power consumption during data backup and restore, according to some embodiments.

FIG. 3B is a schematic of a hybrid memory module 3B00 showing a direct data transmission path used for improving transmission latencies and power consumption during data backup and restore. As an option, one or more instances of hybrid memory module 3B00 or any aspect thereof may be implemented in the context of the architecture and functionality of the embodiments described herein. Also, the hybrid memory module 3B00 or any aspect thereof may be implemented in any desired environment.

The hybrid memory module 3B00 shown in FIG. 3B comprises a direct data transmission path 162 as described herein. The direct data transmission path 162 addresses the problems attendant to implementing a hybrid memory module that exhibits improved transmission latencies and power consumption when transmitting data between the DRAM devices and the NVM devices during data backup and data restore operations. Specifically, the direct data transmission path 162 provides a low-speed direct path between the DRAM devices and the non-volatile memory controller 128 (e.g., at the LDQ/LDQS DRAM interface) for use during data backup and data restore operations. In one or more embodiments, the high bit rate host path can be coupled to a first port (e.g., data port A) of a port switched DRAM device, and the direct data transmission path 162 can be coupled to a second port (e.g., data port B) of the port switched DRAM device. In some cases, a portion of the direct data transmission path 162 can be shared by two or more DRAM devices. Such a low-speed direct path can have several advantages, such as enhanced signal integrity, improved timing margins, eliminated timing training, lower latency (e.g., no DB02 devices in path), and/or other advantages. The direct data transmission path 162 further allows, during backup and restore, the DRAM devices and the command buffer 126 to be in a DLL off mode, and the data buffers (e.g., DB02 devices) to be in a clock stopped power-down mode. Such allowed modes can reduce power consumption, reduce reconfiguration time when switching to/from backup and/or restore, and/or other benefits.

Figure 4A:
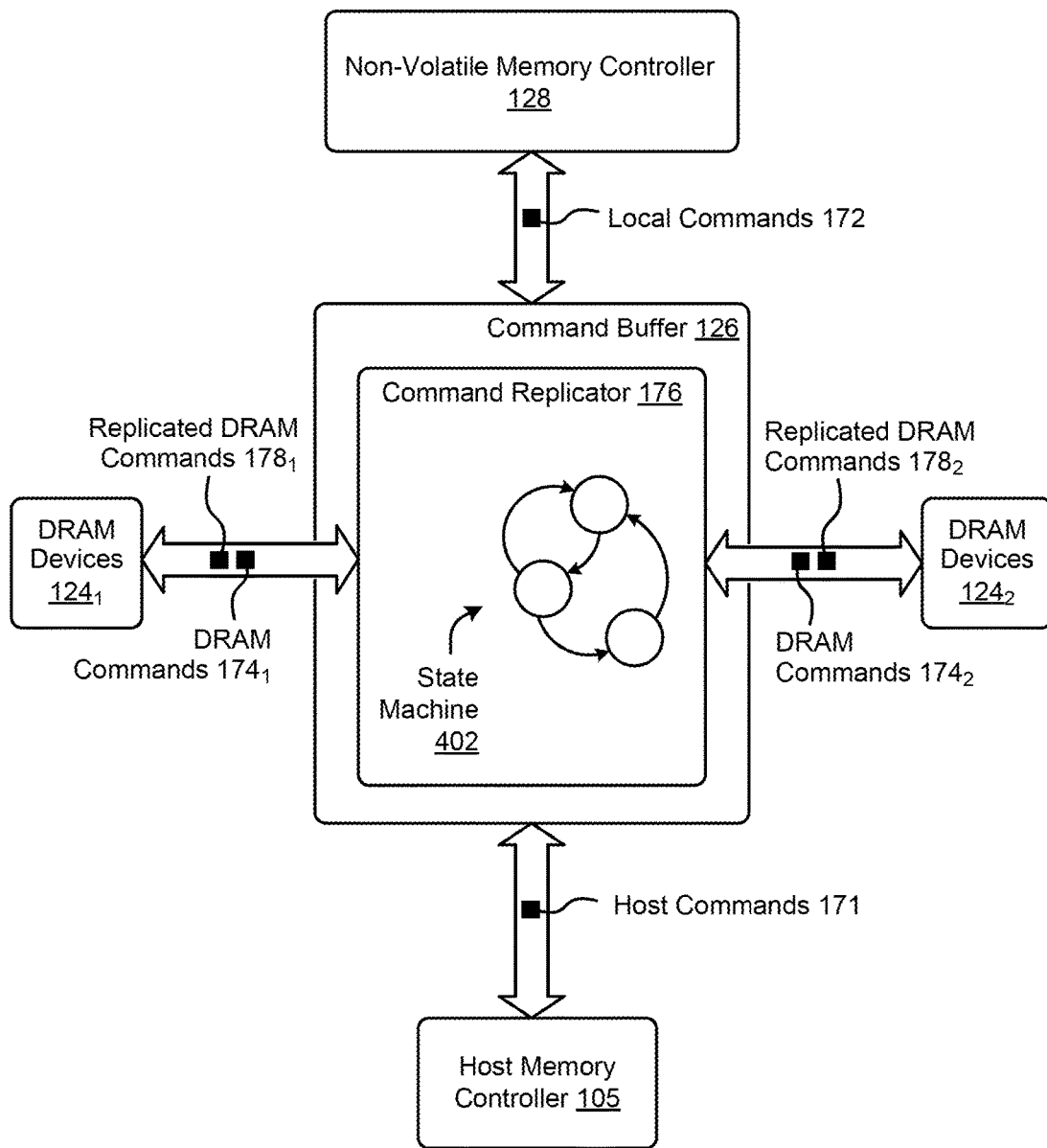
FIG. 4A depicts a command replicator subsystem used for improving data backup and restore throughput in hybrid memory modules, according to some embodiments.

FIG. 4A depicts a command replicator subsystem 4A00 used for improving data backup and restore throughput in hybrid memory modules. As an option, one or more instances of command replicator subsystem 4A00 or any aspect thereof may be implemented in the context of the architecture and functionality of the embodiments described herein. Also, the command replicator subsystem 4A00 or any aspect thereof may be implemented in any desired environment.

The command replicator subsystem 4A00 shown in FIG. 4A addresses the problems attendant with implementing a hybrid memory module that overcomes the throughput limitations of the non-volatile memory controller (NVC) communications interface used for DRAM read and write commands during data backup and data restore operations. Specifically, the local commands 172 issued from the non-volatile memory controller 128 to the command buffer 126 using the LCOM interface (e.g., during data backup and data restore operations) limit the throughput of the data transfer to the LCOM interface command rate. For example, DRAM commands (e.g., DRAM commands 174$_1$, DRAM commands 174$_2$) issued as local commands 172 through the LCOM interface can require 16 LCOM LCK clock cycles per command. As a comparison, DRAM commands issued as host commands 171 from the host memory controller 105 can require four or five DRAM CK clock cycles per command. The command replicator subsystem 4A00 can overcome this limitation by using the command replicator 176 comprising a state machine 402 to generate sequences of replicated DRAM commands (e.g., replicated DRAM commands 178$_1$, replicated DRAM commands 178$_2$) to issue to the DRAM devices in response to respective instances of local commands 172. In one or more embodiments, the state machine 402 can operate at the DRAM clock rate (e.g., CK clock) to enable fast command replication. In one or more embodiments, the replicated DRAM commands can further be generated based in part on various options, such as related to addressing alternate sides, addressing multiple ranks, automatically incrementing addresses, and/or other options.

The command replicator subsystem 4A00 presents merely one partitioning. The specific example shown is purely exemplary, and other partitioning is reasonable. A technique for applying such systems, subsystems, and partitionings to data backup and data restore operations according to the herein disclosed techniques is shown in FIG. 4B.

Figure 4B:
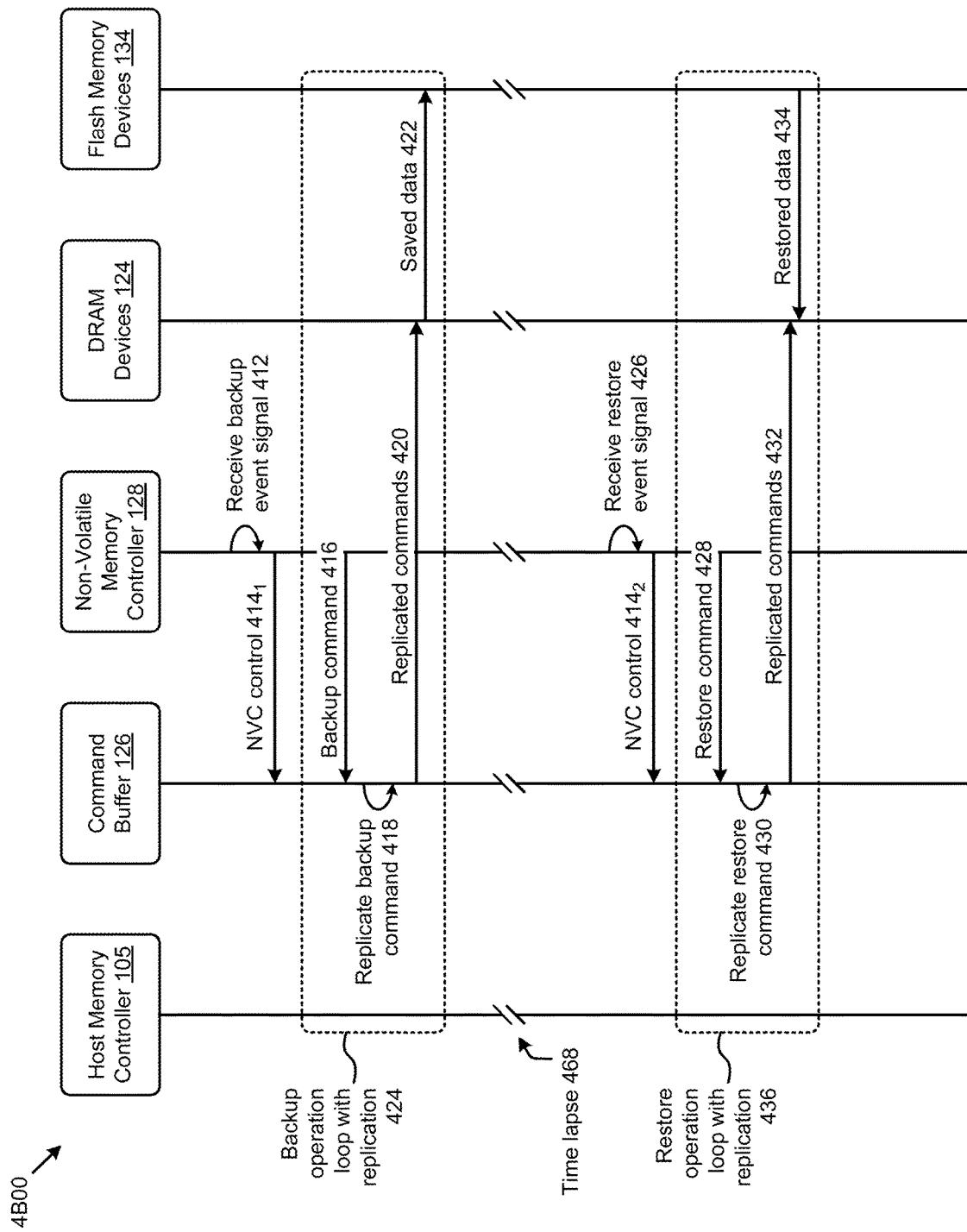
FIG. 4B presents a diagram showing interactions in hybrid memory modules that use a command replicator for improving data backup and restore throughput, according to some embodiments.

FIG. 4B presents a diagram showing interactions in hybrid memory modules 4B00 that use a command replicator for improving data backup and restore throughput. As an option, one or more instances of interactions in hybrid memory modules 4B00 or any aspect thereof may be implemented in the context of the architecture and functionality of the embodiments described herein. Also, the interactions in hybrid memory modules 4B00 or any aspect thereof may be implemented in any desired environment.

As shown in FIG. 4B, the interactions in hybrid memory modules 4B00 pertain to interactions among the earlier described components comprising the host memory controller 105, the command buffer 126, the non-volatile memory controller 128, the collective set of DRAM devices 124, and the flash memory devices 134, according to the herein disclosed techniques for overcoming the throughput limitations of the non-volatile memory controller LCOM interface used for DRAM read and write commands during data backup and data restore operations. In one or more embodiments, the interactions in hybrid memory modules 4B00 can be implemented using the command replicator subsystem 4A00. As shown, the non-volatile memory controller 128 might receive a data backup event signal (see operation 412) triggered, for example, by a detected power loss. In such a case, control can be provisioned to the non-volatile memory controller 128 at the command buffer 126 (see message 414$_1$). The non-volatile memory controller 128 might then invoke the backup operation by sending a backup command to the command buffer 126 (see message 416). For example, the backup command might be delivered using the LCOM interface. The command buffer 126 can replicate the backup command (see operation 418) according to the herein disclosed techniques and issue the replicated commands to the DRAM devices 124 (see message 420) to save data from the DRAM devices 124 to the flash memory devices 134 (see message 422). For example, one LCOM read command can invoke the execution of multiple replicated read commands (e.g., reading a full row of memory), thus increasing the throughput as compared to issuing each read command through the LCOM interface. Such backup interactions with replication can continue in a loop (see loop 424) until the backup operation is complete (e.g., all data is saved).

After a time lapse 468, the non-volatile memory controller 128 might receive a data restore event signal (see operation 426). For example, the line power to the computing system might have returned to trigger the data restore event. In such cases, control can be provisioned to the non-volatile memory controller 128 at the command buffer 126 (see message 414$_2$). The non-volatile memory controller 128 might then invoke the restore process by issuing a restore command to the command buffer 126 (see message 428). For example, the restore command might be delivered using the LCOM interface. The command buffer 126 can replicate the restore command (see operation 430) according to the herein disclosed techniques and issue the replicated commands to the DRAM devices 124 (see message 432) to restore data from the flash memory devices 134 to the DRAM devices 124 (see message 434). For example, one LCOM write command can invoke the execution of multiple replicated write commands (e.g., writing a full row of memory), thus increasing the throughput as compared to issuing each write command through the LCOM interface. Such restore interactions with replication can continue in a loop (see loop 436) until the restore operation is complete (e.g., all data is restored).

The throughput of the backup and restore operations (loop 424 and loop 436, respectively) can be improved due to the replication of the local or LCOM commands (operation 418 and operation 430, respectively) according to the herein disclosed techniques. Embodiments of state machines for performing such replication are discussed as pertains to FIG. 5A and FIG. 5B.

Figure 5A:
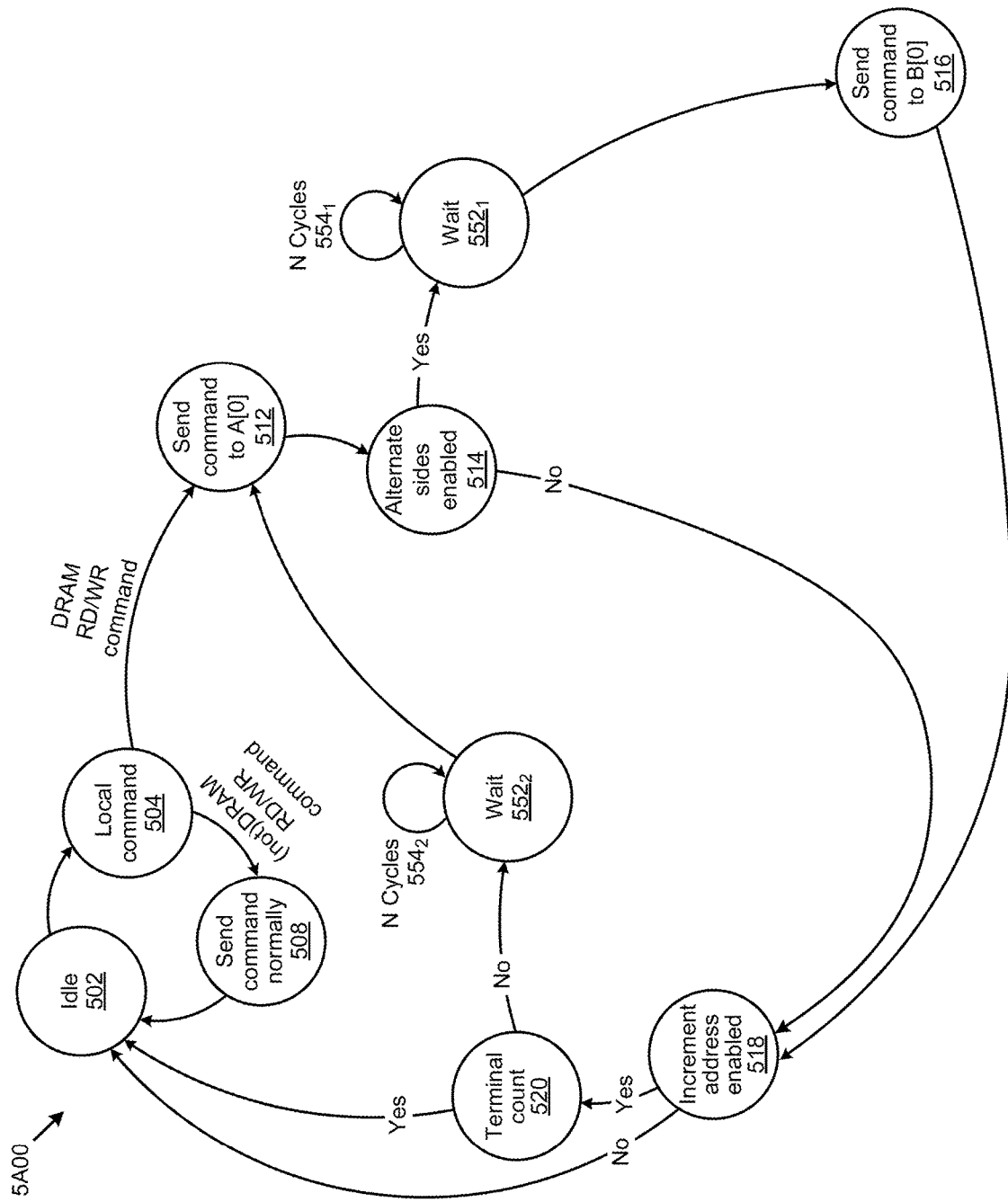
FIG. 5A is a state diagram representing a command replication state machine for accessing both sides of a DRAM array in hybrid memory modules to improve data backup and restore throughput, according to some embodiments.

FIG. 5A is a state diagram representing a command replication state machine 5A00 for accessing both sides of a DRAM array in hybrid memory modules to improve data backup and restore throughput. As an option, one or more instances of command replication state machine 5A00 or any aspect thereof may be implemented in the context of the architecture and functionality of the embodiments described herein. Also, the command replication state machine 5A00 or any aspect thereof may be implemented in any desired environment.

The command replication state machine 5A00 represents one embodiment of the logic used to replicate local commands (e.g., LCOM commands) according to the herein disclosed techniques for overcoming the throughput limitations of the non-volatile memory controller LCOM interface used for DRAM read and write commands during data backup and data restore operations. For example, the command replication state machine 5A00 (e.g., included in the command replicator 176 operating at the command buffer 126) can replicate LCOM DRAM read and/or write commands (e.g., DRAM BC8 commands) one or more times, while optionally accessing alternate sides (e.g., DRAM A/B sides) and/or optionally incrementing to a next command address. Any combination of replication options is possible. In one or more embodiments, the command replication state machine 5A00 can operate at DRAM CK clock speeds, such that the replicated commands can be executed at a higher throughput as compared to the throughput of LCOM commands. Specifically, as shown, the command replication state machine 5A00 might be idle (see state 502) when a local command is received and analyzed (see state 504). If the received local command is not a DRAM read or write command (e.g., a mode register setting or MRS command) the command replication state machine 5A00 can send the command to the DRAM without replication (see state 508). When the received local command is a DRAM read or write command, the command replication state machine 5A00 can send the command to the target side and/or rank address (see state 512), such side A, rank 0 (e.g., A[0]).

When the option of replicating to alternate sides is enabled (see "Yes" path of state 514), the command replication state machine 5A00 can wait (see state 552$_1$) a certain number of clock cycles (e.g., N cycles 554$_1$), such as DRAM CK clock cycles, before sending a replicated instance of the command to side B, rank 0 (e.g., B[0]) (see state 516). In one or more embodiments, the number of cycles (e.g., N cycles 554$_1$) and the corresponding wait time can be configured based on one or more settings. When the option of replicating to alternate sides is disabled (see "No" path of state 514) and the replicated command has been sent to B[0], the current address of the received command can be incremented when the increment address option is enabled (see "Yes" path of state 518). When the address is incremented and a terminal count (e.g., 128 increments comprising a DRAM page) has not been reached (see state 520), the command replication state machine 5A00 can wait (see state 552$_2$) a certain number of DRAM CK clock cycles (e.g., N cycles 554$_2$) before sending a replicated instance of the command to the incremented address at A[0] (see state 512). When the increment address option is disabled (see "No" path of state 518) and/or the terminal count has been reached (see "Yes" path of state 520), the command replication state machine 5A00 can return to the idle state (see state 502).

Figure 5B:
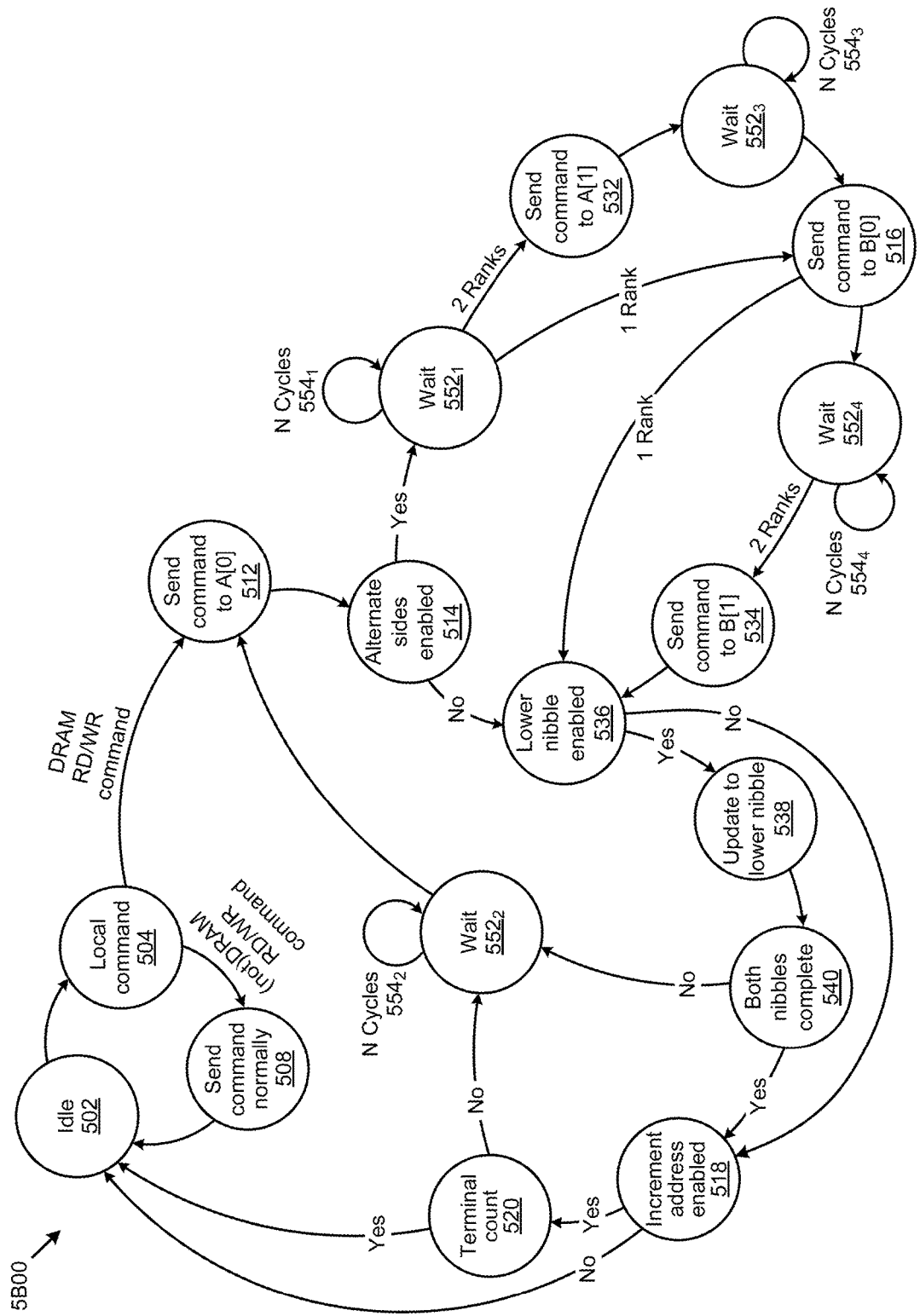
FIG. 5B is a state diagram representing a command replication state machine for accessing multiple sides and/or multiple ranks of a DRAM array in hybrid memory modules to improve data backup and restore throughput, according to some embodiments.

The state machine 402 of the command replicator 176 can further replicate to multiple ranks comprising the DRAM array as represented in the embodiment of FIG. 5B.

FIG. 5B is a state diagram representing a command replication state machine 5B00 for accessing multiple sides and/or multiple ranks of a DRAM array in hybrid memory modules to improve data backup and restore throughput. As an option, one or more instances of command replication state machine 5B00 or any aspect thereof may be implemented in the context of the architecture and functionality of the embodiments described herein. Also, the command replication state machine 5B00 or any aspect thereof may be implemented in any desired environment.

The command replication state machine 5B00 represents one embodiment of the logic used to replicate local commands (e.g., LCOM commands) according to the herein disclosed techniques for overcoming the throughput limitations of the non-volatile memory controller LCOM interface used for DRAM read and write commands during data backup and data restore operations. For example, the command replication state machine 5B00 (e.g., included in the command replicator 176 operating at the command buffer 126) can replicate LCOM DRAM read and/or write commands (e.g., DRAM BC4 commands) one or more times while optionally accessing alternate sides (e.g., DRAM A/B sides) and/or optionally incrementing to a next command address. In some embodiments, the command replication state machine 5B00 can further replicate LCOM DRAM read and/or write commands while optionally accessing various DRAM ranks and/or optionally accommodating various burst orders and/or nibble addressing (e.g., for burst chop commands).

Any combination of replication options is possible. In one or more embodiments, the command replication state machine 5B00 can operate at DRAM CK clock speeds such that the replicated commands can be executed at a higher throughput as compared to the throughput of LCOM commands. Specifically, as shown, the command replication state machine 5B00 might be idle (see state 502) when a local command is received and analyzed (see state 504). If the received local command is not a DRAM read or write command (e.g., a mode register setting or MRS command) the command replication state machine 5B00 can send the command to the DRAM without replication (see state 508). When the received local command is a DRAM read or write command, the command replication state machine 5B00 can send the command to the target side and/or rank address (see state 512) such side A, rank 0 (e.g., A[0]).

When the option of replicating to alternate sides is enabled (see "Yes" path of state 514), the command replication state machine 5B00 can wait (see state $552_1$) a certain number of DRAM CK clock cycles (e.g., N cycles $554_1$) before sending the next replicated command. In one or more embodiments, the number of cycles (e.g., N cycles $554_1$) and the corresponding wait time can be configured based on one or more settings. When two ranks are configured in the DRAM, the command replication state machine 5B00 can send a replicated command to the second rank on the current side (e.g., A[1]) (see state 532), wait (see state $552_3$) a certain number of DRAM CK clock cycles (e.g., N cycles $554_3$), send a replicated command to the alternate side and first rank, such as side B, rank 0 (e.g., B[0]) (see state 516), wait (see state $552_4$) a certain number of DRAM CK clock cycles (e.g., N cycles $554_4$), and send a replicated command to the alternate side and second rank, such as side B, rank 1 (e.g., B[1]) (see state 534). When one rank is configured in the DRAM, the command replication state machine 5B00 can send the replicated command to B[0] following the wait corresponding to state $552_1$.

When the option of replicating for alternate nibbles (e.g., lower nibble) of various burst chop (e.g., BC4) commands is enabled (see "Yes" path of state 536), the command replication state machine 5B00 can update to the next (e.g., lower) nibble in the burst order (see state 538) and determine if both nibbles have been accessed (see state 540). When the selected nibble has not been accessed (see "No" path of state 540), the command replication state machine 5B00 can wait (see state $552_2$) a certain number of DRAM CK clock cycles (e.g., N cycles $554_2$) before sending a replicated instance of the command to the selected nibble and address at A[0] (see state 512). When the option of replicating for alternate nibbles (e.g., lower nibble) of various burst chop commands is disabled (see "No" path of state 536) and/or all nibbles corresponding to the current address have been accessed (see "Yes" path of state 540), the current address of the received command can be incremented when the increment address option is enabled (see "Yes" path of state 518). When the address is incremented and a terminal count (e.g., 128 increments comprising a DRAM page) has not been reached (see state 520), the command replication state machine 5B00 can wait (see state $552_2$) a certain number of DRAM CK clock cycles (e.g., N cycles $554_2$) before sending a replicated instance of the command to the incremented address at A[0] (see state 512). When the increment address option is disabled (see "No" path of state 518) and/or the terminal count has been reached (see state 520), the command replication state machine 5A00 can return to the idle state (see state 502).

Figure 6A:
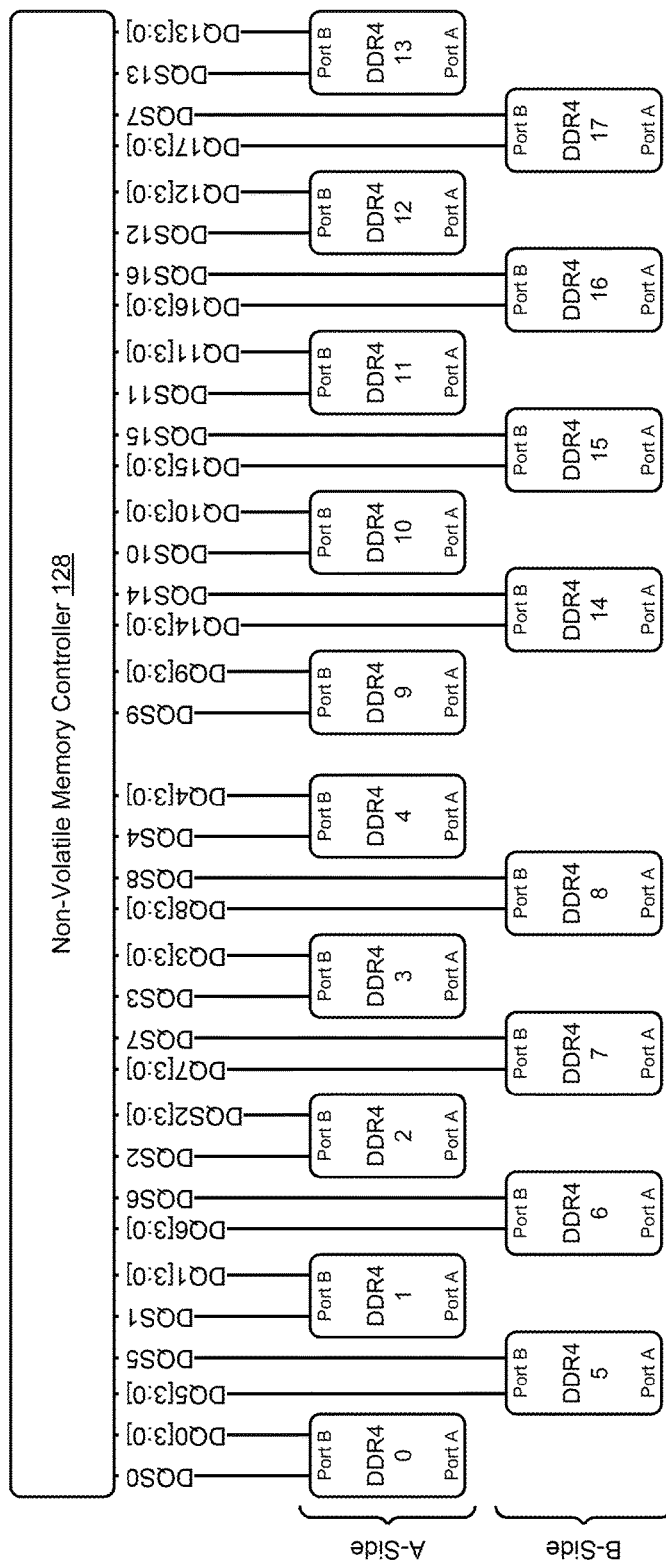
FIG. 6A is a connection diagram of an independent connection configuration for connecting DRAM devices to a non-volatile memory controller for backup, restore, and/or other operations.

The herein disclosed techniques for improving data backup and restore throughput in hybrid memory modules can further enable various connection schemes for coupling the DRAM devices and the non-volatile memory controller. For example, the higher throughput provided by the herein disclosed techniques might enable fewer chip connection paths (e.g., more parallel connections) between the DRAM devices and the non-volatile memory controller, yet still with higher throughput as compared to legacy architectures such as shown in FIG. 6A. Embodiments of such reduced connection configurations implemented using the herein disclosed techniques are discussed in FIG. 6B, FIG. 6C, and FIG. 6D.

FIG. 6A is a connection diagram of an independent connection configuration 6A00 for connecting DRAM devices to a non-volatile memory controller for backup, restore, and/or other operations. The independent connection configuration 6A00 can represent a portion of the connections (e.g., 108 connections) that a hybrid memory module, such as shown in FIG. 3B, might have between the DRAM devices (e.g., DRAM devices $124_1$, DRAM devices $124_2$) and the non-volatile memory controller 128 for backup, restore, and/or other operations. For example, each DRAM device (e.g., DDR4-0, DDR4-1, . . . , to DDR4-17) might have a dedicated bus comprising six signals (e.g., DQS, DQ[3:0], CS) between the DRAM device and the non-volatile memory controller 128. Specifically, the DQSx and DQx[3:0] signals are shown in FIG. 6A for illustrative purposes.

Using the herein disclosed techniques for improving data backup and restore throughput in hybrid memory modules, alternative connection schemes for coupling the DRAM devices and the non-volatile memory controller can be implemented to simplify chip routing, reduce connection trace area and associated chip costs, and other benefits. Such alternative connection schemes (e.g., see FIG. 6B, FIG. 6C, and FIG. 6D) are possible due to the throughput improvements of the herein disclosed techniques.

Figure 6B:
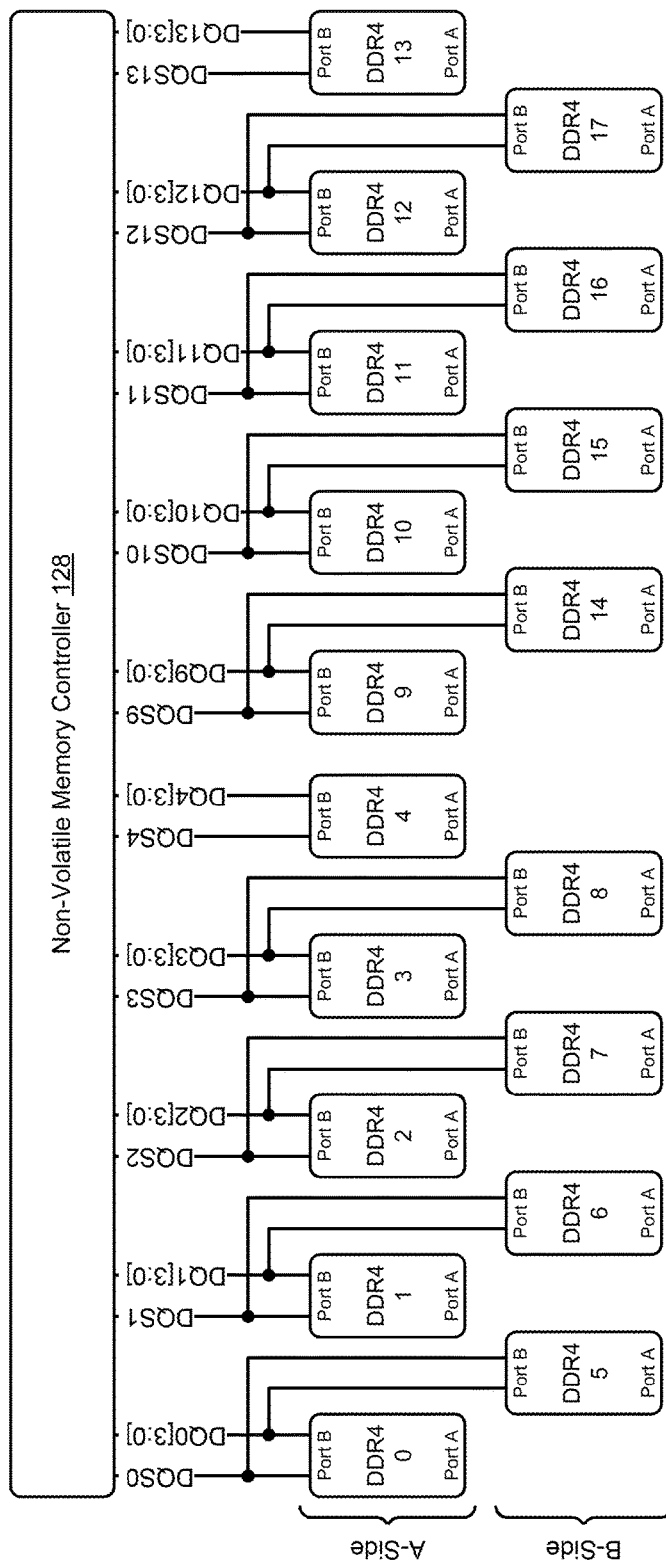
FIG. 6B is a connection diagram of a first dual connection configuration having parallel A-side and B-side connections as implemented in hybrid memory modules with improved data backup and restore throughput, according to some embodiments.

FIG. 6B is a connection diagram of a first dual connection configuration 6B00 having parallel A-side and B-side connections as implemented in hybrid memory modules with improved data backup and restore throughput. As an option, one or more instances of first dual connection configuration 6B00 or any aspect thereof may be implemented in the context of the architecture and functionality of the embodiments described herein. Also, the first dual connection configuration 6B00 or any aspect thereof may be implemented in any desired environment.

As shown in the embodiment comprising the first dual connection configuration 6B00, two DRAM devices can have a shared path for transmitting data signals (e.g., DQ0[3:0], DQ1[3:0], etc.) and data strobe signals (e.g., DQS0, DQS1, etc.) to and/or from the non-volatile memory controller 128. As shown, a given shared path can be coupled to a DRAM device on the A-side of the module and a DRAM device on the B-side of the module. In such cases, the herein disclosed techniques can use the chip select (CS) signal of each DRAM device (not shown) and the option of replicating commands for alternate sides to read to and/or write from the DRAM devices on each of the shared paths. Some DRAM devices (e.g., DDR4-4, DDR4-13) might not use a shared path based on the DRAM configuration.

Figure 6C:
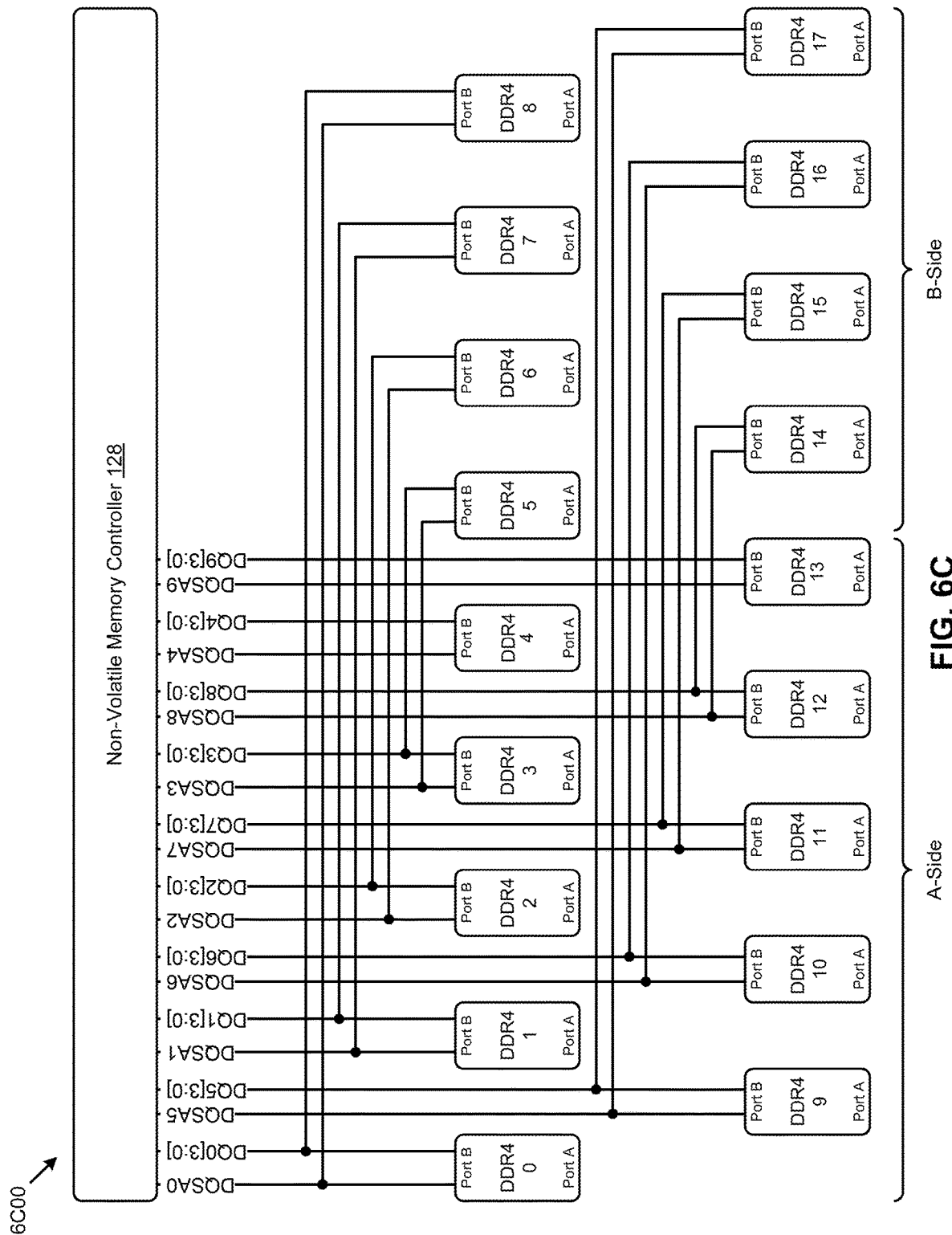
FIG. 6C is a connection diagram of a second dual connection configuration having dual parallel DRAM connections as implemented in hybrid memory modules with improved data backup and restore throughput, according to some embodiments.

FIG. 6C is a connection diagram of a second dual connection configuration 6C00 having dual parallel DRAM connections as implemented in hybrid memory modules with improved data backup and restore throughput. As an option, one or more instances of second dual connection configuration 6C00 or any aspect thereof may be implemented in the context of the architecture and functionality of the embodiments described herein. Also, the second dual connection configuration 6C00 or any aspect thereof may be implemented in any desired environment.

As shown in the embodiment comprising the second dual connection configuration 6C00, two DRAM devices can have a shared path for transmitting data signals (e.g., DQ0[3:0], DQ5[3:0], DQ1[3:0], etc.) and data strobe signals (e.g., DQSA0, DQSA5, etc.) to and/or from the non-volatile memory controller 128. As shown, a given shared path can be coupled to a DRAM device on the A-side of the module and a DRAM device on the B-side of the module. In such cases, the herein disclosed techniques can use the chip select (CS) signal of each DRAM device (not shown) and the option of replicating commands for alternate sides to read to and/or write from the DRAM devices on each of the shared paths. Some DRAM devices (e.g., DDR4-4, DDR4-13) might not use a shared path based on the DRAM configuration.

Figure 6D:
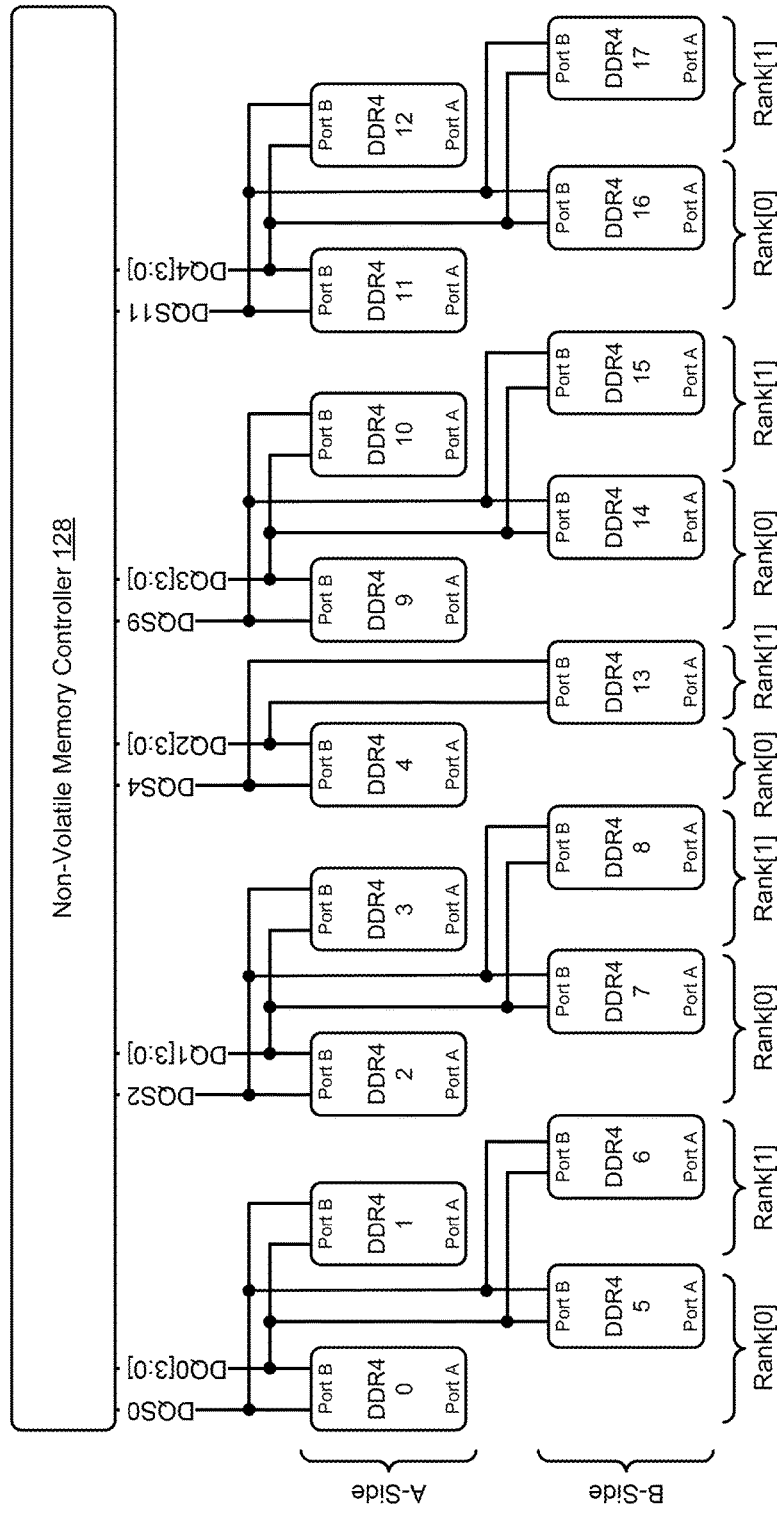
FIG. 6D is a connection diagram of a quad connection configuration having quad parallel DRAM connections as implemented in hybrid memory modules with improved data backup and restore throughput, according to some embodiments.

FIG. 6D is a connection diagram of a quad connection configuration 6D00 having quad parallel DRAM connections as implemented in hybrid memory modules with improved data backup and restore throughput. As an option, one or more instances of quad connection configuration 6D00 or any aspect thereof may be implemented in the context of the architecture and functionality of the embodiments described herein. Also, the quad connection configuration 6D00 or any aspect thereof may be implemented in any desired environment.

As shown in the embodiment comprising the quad connection configuration 6D00, four DRAM devices can have a shared path for transmitting data signals (e.g., DQ0[3:0], DQ1[3:0], etc.) and data strobe signals (e.g., DQS0, DQS2, etc.) to and/or from the non-volatile memory controller 128. As shown, a given shared path can be coupled to a DRAM device from each rank (e.g., rank[0], rank[1]) on the A-side of the module, and a DRAM device from each rank (e.g., rank[0], rank[1]) on the B-side of the module. In such cases, the herein disclosed techniques can use the chip select (CS) signal of each DRAM device (not shown) and the option of replicating commands for alternate sides and/or multiple ranks to read to and/or write from the DRAM devices on each of the shared paths. Any number of DRAM devices (e.g., see DDR4-4 and DDR4-13) can use a shared path, and/or not use a shared path, based on the DRAM configuration.

Figure 7A:
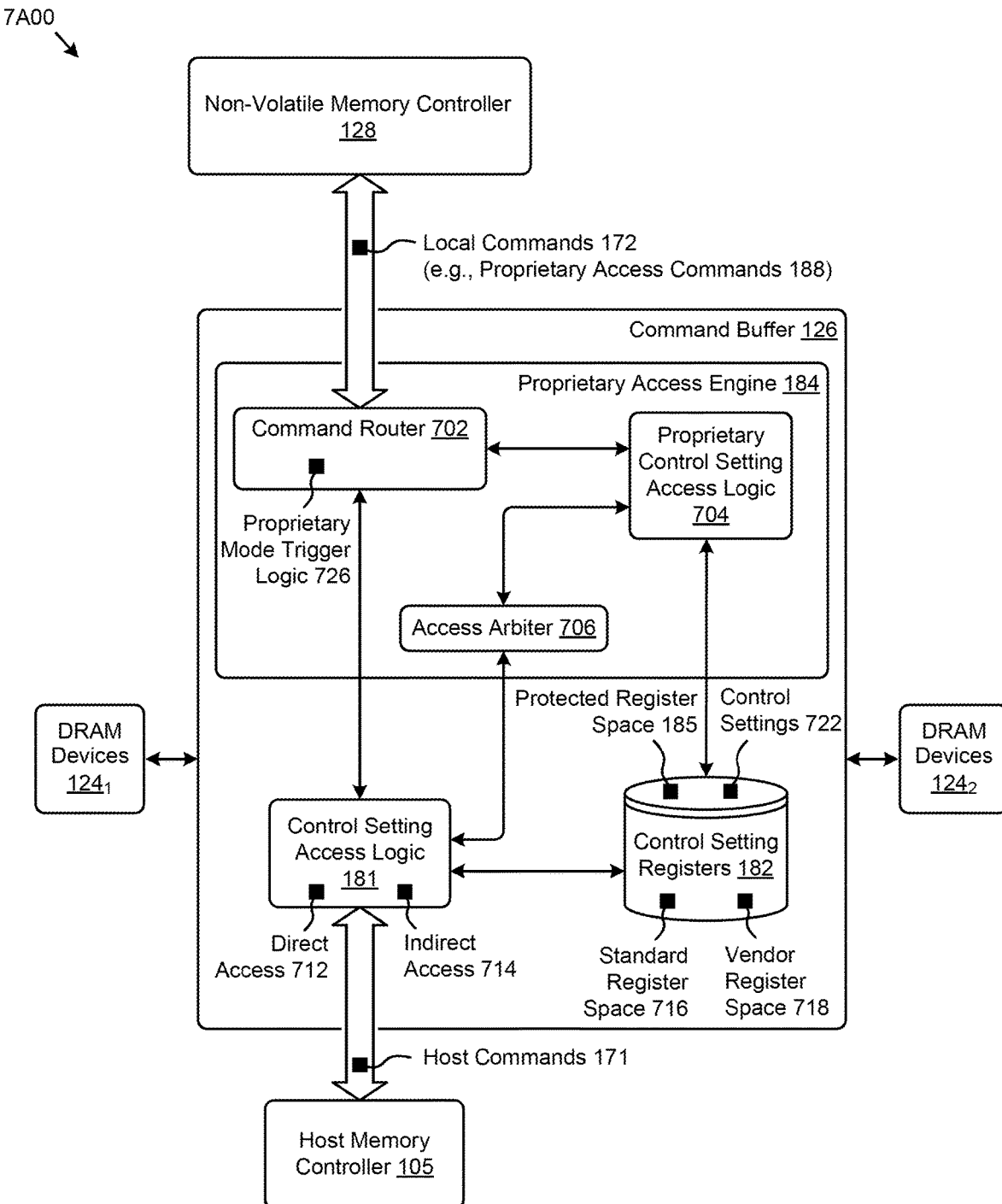
FIG. 7A is a diagram of a proprietary access subsystem as implemented in systems for enhancing non-volatile memory controller resource access, according to some embodiments.

FIG. 7A is a diagram of a proprietary access subsystem 7A00 as implemented in systems for enhancing non-volatile memory controller resource access. As an option, one or more instances of proprietary access subsystem 7A00 or any aspect thereof may be implemented in the context of the architecture and functionality of the embodiments described herein. Also, the proprietary access subsystem 7A00 or any aspect thereof may be implemented in any desired environment.

In some implementations of the command buffer 126, such as those defined by JEDEC, a set of control settings 722 stored in the control setting registers 182 can be accessed using the control setting access logic 181. The control setting registers 182 might have a standard register space 716 (e.g., JEDEC-defined function spaces 0-7) and a vendor register space 718 (e.g., JEDEC-defined function spaces 8-15). In some cases, the control setting access logic 181 can provide a direct access 712 to the control setting registers 182. In other cases, the control setting access logic 181 can provide an indirect access 714 to the control setting registers 182. For example, function space 0 might be accessed directly, yet reads and/or writes to function spaces 1-15 might be accessed through function 0 (e.g., by a combination of F0RC4x, F0RC5x, and F0RC6x writes). Further, the host memory controller 105 and the non-volatile memory controller 128 can have full access, to at least the standard register space 716, when in a host control mode and a non-volatile memory controller control mode (e.g., NVC control mode), respectively. Yet, in the host control mode, the non-volatile memory controller 128 might have restricted access to a protected register space 185. For example, to avoid conflicts among the host commands 171 issued by the host memory controller 105 and the local commands 172 issued by the non-volatile memory controller 128 in host control mode, the control setting access logic 181 might allow the non-volatile memory controller 128 access to a subset of the standard register space 716 (e.g., control word locations F0RC07, F4RC00, and F4RC02), yet no access to the protected register space 185. Such restricted access can result in long latencies and high power consumption when a backup and/or restore event is invoked since the non-volatile memory controller 128 is limited in its ability to prepare certain settings (e.g., in the protected register space 185) in advance of such events.

The proprietary access subsystem 7A00 shown in FIG. 7A addresses such resource access restrictions for the non-volatile memory controller 128, yet does not impact the host memory controller 105 resource access. Specifically, in one or more embodiments, the proprietary access subsystem 7A00 can comprise a proprietary access engine 184 to interpret one or more local commands 172 from the non-volatile memory controller 128 to access the protected register space 185 while still in the host control mode. Specifically, in some embodiments, the proprietary access engine 184 might receive a sequence of the local commands 172 that trigger a proprietary mode such that subsequent instances of local commands 172 can be interpreted as instances of proprietary access commands 188 for accessing the protected register space 185.

In one or more embodiments, the proprietary access engine 184 can comprise a set of proprietary control setting access logic 704, based in part on the control setting access logic 181, to interpret the proprietary access commands 188 to write to and/or read from the protected register space 185. Further, the proprietary access engine 184 might comprise a command router 702 to route the local commands 172 to the control setting access logic 181 and route the proprietary access commands 188 to the proprietary control setting access logic 704. Further, the command router 702 might comprise a set of proprietary mode trigger logic 726 to decode received instances of local commands 172 to determine when the proprietary mode can be enabled. Also, in some embodiments, the proprietary access engine 184 can comprise an access arbiter 706 to allow only one of the host commands 171 and proprietary access commands 188 access to the control setting registers 182 at a given time.

The proprietary access subsystem 7A00 presents merely one partitioning. The specific example shown is purely exemplary, and other partitioning is reasonable. A technique for expanding the non-volatile memory controller resource access, yet not impact host memory controller resource access, implemented in such systems, subsystems, and partitionings is shown in FIG. 7B.

Figure 7B:
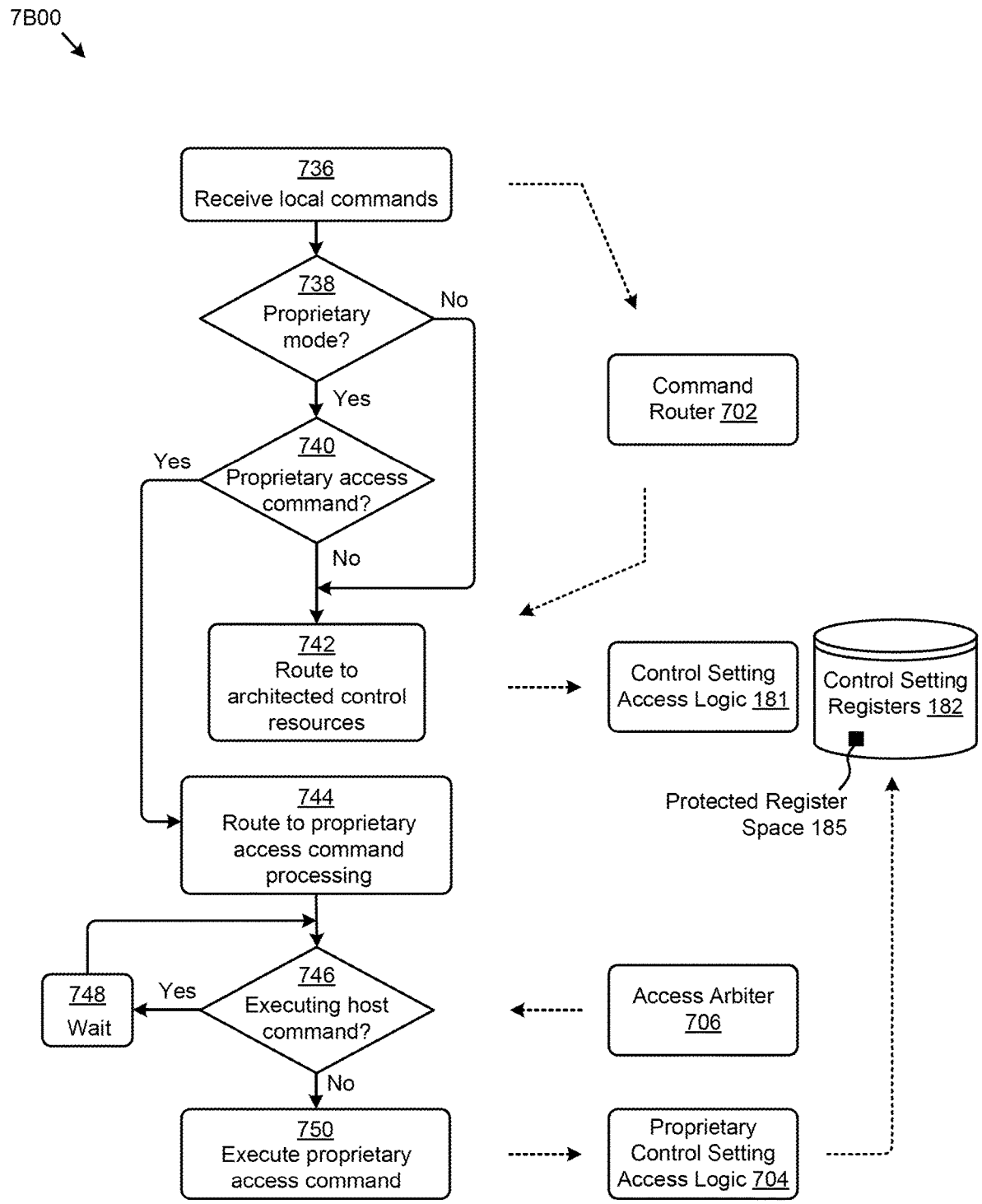
FIG. 7B illustrates a proprietary access protocol as used in hybrid memory modules for enhancing non-volatile memory controller resource access, according to some embodiments.

FIG. 7B illustrates a proprietary access protocol 7B00 as used in hybrid memory modules for enhancing non-volatile memory controller resource access. As an option, one or more instances of proprietary access protocol 7B00 or any aspect thereof may be implemented in the context of the architecture and functionality of the embodiments described herein. Also, the proprietary access protocol 7B00 or any aspect thereof may be implemented in any desired environment.

The proprietary access protocol 7B00 presents one embodiment of certain steps for expanding the non-volatile memory controller resource access, yet not impact host memory controller resource access, during a host control mode. In one or more embodiments, the steps and underlying operations shown in the proprietary access protocol 7B00 can be executed by the command buffer 126 disclosed herein. As shown, the proprietary access protocol 7B00 can commence with receiving local commands (see step 736), such as LCOM commands defined by JEDEC. The received local commands can be used to determine if a proprietary mode can be enabled (see decision 738). In one or more embodiments, the proprietary mode can allow the local commands to be interpreted, routed, and processed as proprietary access commands (e.g., proprietary access commands 188). In such cases, when the proprietary mode is enabled and the received local command is a proprietary access command (see decision 740), the proprietary access command can be routed (e.g., by command router 702) for proprietary access command processing (see step 744). When the proprietary mode is not enabled and/or the received command is not a proprietary access command, the received local command can be routed to the architected control setting resources (see step 742), such as the control setting access logic 181 and/or the control setting registers 182. In such cases, the received local command may not be able to access the protected register space 185 when in host control mode. Yet, when proprietary mode is enabled and a proprietary access command is received, the proprietary access protocol 7B00 might further determine (e.g., by access arbiter 706) whether a host command is being executed (see decision 746). When a host command is being executed, a certain wait delay can transpire (see step 748) before returning to check the host command execution status. When there are no host commands executing, the proprietary access command can be executed (see step 750), for example, by the proprietary control setting access logic 704, to access the protected register space 185 during host control mode, according to the herein disclosed techniques.

Figure 8A:
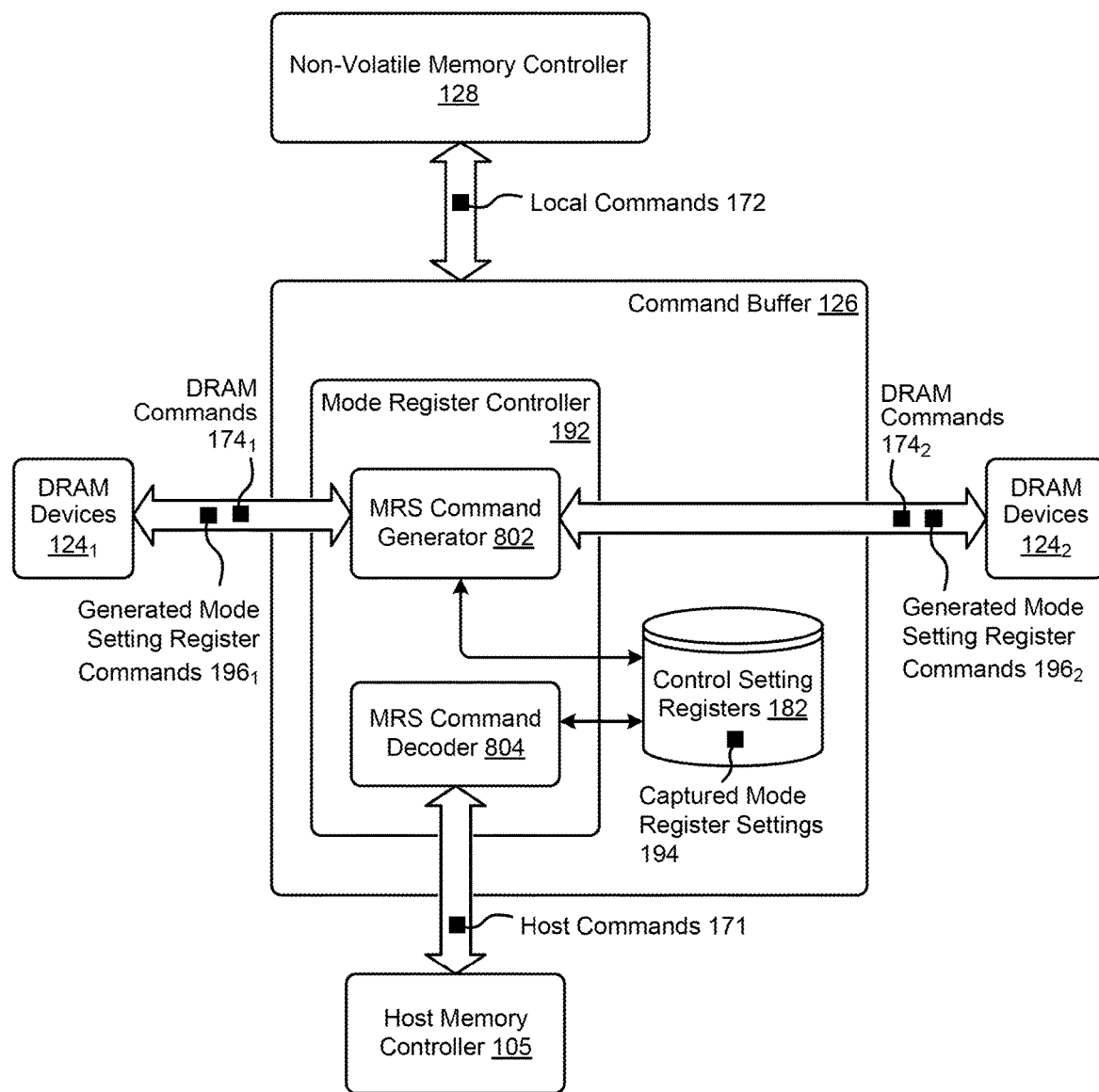
FIG. 8A depicts a mode register controller subsystem used in hybrid memory modules for enhancing the programmability of the DRAM mode register settings in a non-volatile memory controller control mode, according to some embodiments.

FIG. 8A depicts a mode register controller subsystem 8A00 used in hybrid memory modules for enhancing the programmability of the DRAM mode register settings in a non-volatile memory controller control mode. As an option, one or more instances of mode register controller subsystem 8A00 or any aspect thereof may be implemented in the context of the architecture and functionality of the embodiments described herein. Also, the mode register controller subsystem 8A00 or any aspect thereof may be implemented in any desired environment.

As shown in FIG. 2B, different mode register settings (see message 261, message 275, and message 285) in the DRAM devices might be required in a host control mode and/or an NVC control mode due to various reasons, such as different operating frequencies and capabilities in the respective modes. The time and power required to execute the mode register setting or MRS commands can impact the performance of the hybrid memory module when switching between a host control mode and an NVC control mode, such as when invoked during data backup and data restore operations. In some cases, the non-volatile memory controller 128 might read some of the mode register setting data from the DRAM devices to reprogram the mode register settings for the DRAM devices (e.g., when entering and/or leaving an NVC control mode), yet some mode register settings data (e.g., certain register bits) are not accessible by the non-volatile memory controller 128. Such restricted accessibility to protected register bits can limit the ability of the non-volatile memory controller 128 to modify the mode register settings (e.g., comprising accessible register bits and protected register bits) of the DRAM devices when in NVC control mode, yet not overwrite certain register settings established when in host control mode. Further, writing the DRAM mode register settings (e.g., using MRS commands) using the LCOM interface of the non-volatile memory controller 128 can be costly in terms of execution latencies and power consumption, as the LCOM protocol can require 128 DRAM clock cycles per DRAM command (e.g., read, write, etc.) issued from the non-volatile memory controller 128.

The mode register controller subsystem 8A00 shown in FIG. 8A addresses such limitations by enhancing the programmability of the DRAM mode register settings in a non-volatile memory controller control mode (e.g., NVC control mode), such as when invoked during data backup and data restore operations. Specifically, in one or more embodiments, the mode register controller subsystem 8A00 can receive host commands 171 from the host memory controller 105, receive local commands 172 from the non-volatile memory controller 128, and issue DRAM commands (e.g., DRAM commands $174_1$, DRAM commands $174_2$) to the DRAM devices (e.g., DRAM devices $124_1$, DRAM devices $124_2$). For example, such DRAM commands can be mode register setting (MRS) commands issued by the host memory controller 105 (e.g., during host control mode) and/or by the non-volatile memory controller 128 (e.g., during NVC control mode). Further, the mode register controller subsystem 8A00 can comprise a mode register controller 192 to capture (e.g., "snoop") a set of captured mode register settings 194 from the host commands 171 and generate certain generated mode register setting commands (e.g., generated mode register setting commands $196_1$, generated mode register setting commands $196_2$) based on the captured mode register settings 194.

More specifically, in some embodiments, the captured mode register settings 194 can be extracted from the host commands 171 by a MRS command decoder 804. Further, the generated mode register setting commands can be generated at least in part from the captured mode register settings 194 by an MRS command generator 802. In one or more embodiments, the generated mode register setting commands can be issued to the DRAM devices from the command buffer 126, responsive to receiving certain instances of the local commands 172. In some embodiments, the captured mode register settings 194 can be modified before being used to produce the generated mode register setting commands. For example, certain register bits might need to be toggled for NVC control mode, yet other register bits established while in host control mode (e.g., related to timing training) might need to remain in their current state. As another example, certain events occurring during the NVC control mode might require certain mode register settings to be different after leaving the NVC control mode as compared to when entering the NVC mode (e.g., based on temperature, termination mode, termination values, etc.). Further, in some cases, the captured mode register settings 194 can be captured when the host memory controller 105 initializes the hybrid memory module comprising the mode register controller subsystem 8A00. The captured mode register settings 194 can further be accessed and/or modified by the host memory controller 105 or the non-volatile memory controller 128 (e.g., for reading, writing, modifying, etc.). Also, the captured mode register settings 194 might be stored in the control setting registers 182 of the command buffer 126.

The mode register controller subsystem 8A00 presents merely one partitioning. The specific example shown is purely exemplary, and other partitioning is reasonable. A technique for improving latencies and power consumption when switching between a host control mode and an NVC control mode implemented in such systems, subsystems, and partitionings is shown in FIG. 8B.

FIG. 8B is a diagram showing interactions 8B00 in hybrid memory modules that implement a mode register controller for enhancing the programmability of the DRAM mode register settings in a non-volatile memory controller control mode. As an option, one or more instances of interactions 8B00 or any aspect thereof may be implemented in the context of the architecture and functionality of the embodiments described herein. Also, the interactions 8B00 or any aspect thereof may be implemented in any desired environment.

As shown in FIG. 8B, the interactions 8B00 pertain to the earlier described components comprising the host memory controller 105, the command buffer 126, the non-volatile memory controller 128, the collective set of DRAM devices 124, and the flash memory devices 134, according to the herein disclosed techniques for improving latencies and power consumption when switching between a host control mode and an NVC control mode, such as invoked by data backup and data restore events. In one or more embodiments, the interactions 8B00 can be implemented using the mode register controller subsystem 8A00. As shown, the command buffer 126 might receive one or more host commands from the host memory controller 105 (see message 812) in a host control mode to be forwarded to the DRAM devices 124 (see message 814). In some cases, the command buffer 126 can decode any MRS commands included in the host commands (see operation 816) and capture the mode register settings from the decoded MRS commands (see operation 818). For example the captured mode register settings might represent the settings that have been determined (e.g., using timing training, etc.) to be appropriate for the host control mode.

After a time lapse 822, a data backup or restore event signal might be received by the non-volatile memory controller 128 (see operation 824). In response, control can be provisioned to the non-volatile memory controller 128 by, for example, writing to certain control register settings of the command buffer 126 (see message 826). In some cases, the non-volatile memory controller 128 might need to modify certain mode register settings to prepare the DRAM devices 124 for NVC control. Specifically, certain register bits might need to be toggled for NVC control mode, yet other register bits established while in host control mode (e.g., related to timing training) might need to remain in their current state. According to the herein disclosed techniques, such modifications can be executed using the earlier captured mode register settings (see grouping 836). More specifically, the non-volatile memory controller 128 can issue certain mode register settings commands (see message 828) to the command buffer 126 indicating the register bits to be set for operations during NVC control mode. The command buffer 126 can apply the received register settings to the captured mode register settings to generate a set of modified captured mode register settings (see operation 830). The command buffer 126 can use the modified captured mode register settings to generate a set of MRS commands (see operation $832_1$) that can be issued directly to the DRAM devices 124 (see message $834_1$).

When the non-volatile memory controller 128 completes the execution of the backup or restore operations (see operation 838), a process for restoring the host mode register settings can commence (see grouping 840). Specifically, the captured mode register settings might be modified (see operation 842) based on certain information (e.g., changes in chip temperature, DRAM configuration, etc.). The non-volatile memory controller 128 can then issue a trigger command to the command buffer 126 (see message 844) to invoke the generation of MRS commands (see operation $832_2$) based on the captured and/or modified mode register settings, according to the herein disclosed techniques. In some cases, the trigger command may not be required to invoke the MRS command generation. The generated MRS command can then be issued by the command buffer 126 to the DRAM devices 124 (see message $834_2$) prior to provisioning control back to the host memory controller 105.

The techniques illustrated in FIG. 8B and described herein enable the modification of the mode register settings of the DRAM devices 124 when in NVC control mode, yet not overwrite certain register settings established when in host control mode. Further, by reducing the number of commands from the non-volatile memory controller in restoring the host mode register settings, the herein disclosed techniques improve the latencies and power consumption when switching from the NVC control mode to the host control mode. For example, in some embodiments, the command buffer 126 can issue a set of generated MRS commands sixteen times faster as compared to issuing the MRS commands using the LCOM interface of the non-volatile memory controller 128. Further, as another example, all seven MRS commands (e.g., for MRS0 to MRS6) can be completed in 49 DRAM CK clocks per rank, including a tMRD wait.

Additional Examples

It should be noted that there are alternative ways of implementing the embodiments disclosed herein. Accordingly, the embodiments and examples presented herein are to be considered as illustrative and not restrictive, and the claims are not to be limited to the details given herein, but may be modified within the scope and equivalents thereof.

ADDITIONAL EMBODIMENTS OF THE DISCLOSURE

In the foregoing specification, the disclosure has been described with reference to specific embodiments thereof. It will, however, be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are, accordingly, to be regarded in an illustrative sense rather than in a restrictive sense.

What is claimed is:

1. A method of operation by a command buffer chip, the method comprising:
   receiving one or more host commands from a host memory controller via a first interface;
   issuing one or more dynamic random access memory (DRAM) commands to one or more DRAM devices via a second interface;
   receiving one or more local commands from a non-volatile memory controller via a third interface;
   capturing one or more mode register settings from the one or more host commands;
   modifying at least one of the one or more mode registered settings based on the one or more local commands to produce one or more modified mode register settings;
   generating one or more mode register setting commands based at least in part on the one or more modified mode register settings; and
   issuing the one or more mode register setting commands to the one or more DRAM devices via the second interface.

2. The method of claim 1, wherein issuing the one or more mode register setting commands comprises issuing the one or more mode register setting commands to the one or more DRAM devices responsive to receiving the one or more local commands.

3. The method of claim 1, wherein issuing the one or more mode register setting commands comprises issuing the one or more mode register setting commands to the one or more DRAM devices responsive to at least one of a data backup event or a data restore event.

4. The method of claim 1, further comprising storing the one or more modified mode register settings in one or more control setting registers of the command buffer chip.

5. The method of claim 4, further comprising providing access to the one or more control setting registers by the host memory controller or the non-volatile memory controller.

6. The method of claim 4, further comprising providing access to one or more bits of the one or more control setting registers by the non-volatile memory controller.

7. The method of claim 4, further comprising prohibiting access to one or more protected bits of the one or more control setting registers by the non-volatile memory controller.

8. A method of operation by a memory system, the method comprising:
   receiving, by a command buffer, one or more host commands from a host memory controller;
   receiving, by the command buffer, one or more local commands from a non-volatile memory controller;
   storing, by the command buffer, settings in one or more control setting registers;
   capturing, by a mode register controller, one or more captured mode register settings from the one or more host commands;
   modifying, by the mode register controller, at least one of the one or more captured mode register settings based on the one more local commands to produce one or more modified captured mode register settings; and
   generating, by the mode register controller, one or more generated mode register setting commands based at least in part on the one or more modified captured mode register settings.

9. The method of claim 8, further comprising issuing, by the command buffer, the one or more generated mode register setting commands to one or more dynamic random access memory (DRAM) devices.

10. The method of claim 8, further comprising issuing, by the command buffer, the one or more generated mode register setting commands to one or more dynamic random access memory (DRAM) devices responsive to the receiving the one or more local commands.

11. The method of claim 8, further comprising issuing, by the command buffer, the one or more generated mode register setting commands to one or more dynamic random access memory (DRAM) devices responsive to at least one of a data backup event or a data restore event.

12. The method of claim 8, further comprising storing the one or more modified captured mode register settings in the one or more control setting registers of the command buffer.

13. The method of claim 12, further comprising providing access to the one or more control setting registers of the command buffer by the host memory controller or the non-volatile memory controller.

14. The method of claim 12, further comprising prohibiting access to one or more protected bits of the one or more control setting registers by the non-volatile memory controller.

15. The method of claim 8, wherein capturing the one or more captured mode register settings from the one or more host commands comprises capturing the one or more captured mode register settings from the one or more host commands during an initialization of the memory system.

16. A method of operation by a memory system, the method comprising:
   receiving, by a command buffer, one or more host commands from a host memory controller;
   receiving, by the command buffer, one or more local commands from a non-volatile memory controller;
   capturing, by a mode register controller, one or more captured mode register settings from the one or more host commands;
   modifying, by the mode register controller, at least one of the one or more captured mode register settings based on the one more local commands to produce one or more modified captured mode register settings; and generating, by the mode register controller, one or more generated mode register setting commands based at least in part on the one or more modified captured mode register settings, wherein at least one of the one or more modified captured mode register settings comprises one or more accessible register bits accessible by the non-volatile memory controller.

17. The method of claim 16, further comprising issuing, by the command buffer, the one or more generated mode register setting commands to one or more dynamic random access memory (DRAM) devices.

18. The method of claim 16, further comprising issuing, by the command buffer, the one or more generated mode register setting commands to one or more dynamic random access memory (DRAM) devices responsive to the receiving the one or more local commands.

19. The method of claim 16, further comprising issuing, by the command buffer, the one or more generated mode register setting commands to one or more dynamic random access memory (DRAM) devices responsive to at least one of a data backup event or a data restore event.

20. The method of claim 16, further comprising storing the one or more modified captured mode register settings in one or more control setting registers of the command buffer.

* * * * *